(12) United States Patent
Begarney et al.

(10) Patent No.: US 8,778,079 B2
(45) Date of Patent: Jul. 15, 2014

(54) CHEMICAL VAPOR DEPOSITION REACTOR

(75) Inventors: Michael J. Begarney, Westfield, NJ (US); Frank J. Campanale, Somerset, NJ (US)

(73) Assignee: Valence Process Equipment, Inc., Branchburg, NJ (US)

( * ) Notice: Subject to any disclaimer, the term of this patent is extended or adjusted under 35 U.S.C. 154(b) by 1043 days.

(21) Appl. No.: 12/248,167

(22) Filed: Oct. 9, 2008

(65) Prior Publication Data

US 2012/0111271 A1    May 10, 2012

Related U.S. Application Data

(60) Provisional application No. 60/979,181, filed on Oct. 11, 2007.

(51) Int. Cl.
| C23C 16/455 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl.
USPC ............... 118/715; 156/345.33; 156/345.34

(58) Field of Classification Search
USPC ................. 118/715; 156/345.33–345.34
See application file for complete search history.

(56) References Cited

U.S. PATENT DOCUMENTS

| 3,398,718 A * | 8/1968 | Pilloton .................. 118/716 |
| 3,621,812 A * | 11/1971 | Hissong, Jr. et al. .......... 18/725 |
| 3,673,983 A | 7/1972 | Strater et al. |
| 4,392,453 A | 7/1983 | Luscher |
| 4,579,080 A | 4/1986 | Martin et al. |
| 4,596,208 A | 6/1986 | Wolfson et al. |
| 4,641,603 A | 2/1987 | Miyazaki et al. |
| 4,714,091 A | 12/1987 | Wagner |
| 4,772,356 A | 9/1988 | Schumaker et al. |
| 4,838,983 A | 6/1989 | Schumaker et al. |
| 4,961,399 A | 10/1990 | Frijlink |

(Continued)

FOREIGN PATENT DOCUMENTS

| CN | 1774525 A | 5/2006 |
| DE | 1521538 A1 | 9/1969 |

(Continued)

OTHER PUBLICATIONS

Fotiadis, Dimitrios I.; Kieda, Shigekazu; Transport Phenomena in Vertical Reactors for Metalorganic Vapor Phase Epitaxy; Article from Journal of Crystal Growth (Department of Chemical Engineering and Materials Science and Minnesota Supercomputer Institute, University of Minnesota); 1990, vol. 102, pp. 441-470.

(Continued)

*Primary Examiner* — Rudy Zervigon
(74) *Attorney, Agent, or Firm* — Norris McLaughlin & Marcus, P.A.

(57) ABSTRACT

A CVD reactor, such as a MOCVD reactor conducting metalorganic chemical vapor deposition of epitaxial layers, is provided. The CVD or MOCVD reactor generally comprises a flow flange assembly, adjustable proportional flow injector assembly, a chamber assembly, and a multi-segment center rotation shaft. The reactor provides a novel geometry to specific components that function to reduce the gas usage while also improving the performance of the deposition.

19 Claims, 25 Drawing Sheets

(56) References Cited

U.S. PATENT DOCUMENTS

| | | | | |
|---|---|---|---|---|
| 4,969,416 | A | 11/1990 | Schumaker et al. | |
| 4,991,540 | A | 2/1991 | Jurgensen et al. | |
| 5,027,746 | A | 7/1991 | Frijlink | |
| 5,062,386 | A | 11/1991 | Christensen | |
| 5,124,014 | A * | 6/1992 | Foo et al. | 438/694 |
| 5,162,256 | A | 11/1992 | Jurgensen | |
| 5,173,336 | A | 12/1992 | Kennedy et al. | |
| 5,284,519 | A * | 2/1994 | Gadgil | 118/719 |
| 5,336,324 | A | 8/1994 | Stall et al. | |
| 5,344,492 | A * | 9/1994 | Sato et al. | 118/725 |
| 5,368,646 | A | 11/1994 | Yasuda et al. | |
| 5,441,703 | A | 8/1995 | Jurgensen | |
| 5,534,068 | A | 7/1996 | Beach et al. | |
| 5,628,829 | A | 5/1997 | Foster et al. | |
| 5,759,281 | A | 6/1998 | Gurary et al. | |
| 5,792,272 | A * | 8/1998 | van Os et al. | 118/723 R |
| 5,833,754 | A | 11/1998 | Ito et al. | |
| 5,835,678 | A | 11/1998 | Li et al. | |
| 5,863,338 | A | 1/1999 | Yamada et al. | |
| 5,871,586 | A | 2/1999 | Crawley et al. | |
| 5,935,337 | A * | 8/1999 | Takeuchi et al. | 118/724 |
| 6,001,183 | A | 12/1999 | Gurary et al. | |
| 6,001,267 | A * | 12/1999 | Os et al. | 216/67 |
| 6,036,783 | A * | 3/2000 | Fukunaga et al. | 118/724 |
| 6,066,836 | A | 5/2000 | Chen et al. | |
| 6,080,241 | A | 6/2000 | Li et al. | |
| 6,090,210 | A | 7/2000 | Ballance et al. | |
| 6,113,705 | A | 9/2000 | Ohashi et al. | |
| 6,143,077 | A | 11/2000 | Ikeda et al. | |
| 6,178,918 | B1 * | 1/2001 | van Os et al. | 118/723 R |
| 6,197,121 | B1 | 3/2001 | Gurary et al. | |
| 6,214,121 | B1 | 4/2001 | Cho et al. | |
| 6,221,155 | B1 | 4/2001 | Keck et al. | |
| 6,302,965 | B1 * | 10/2001 | Umotoy et al. | 118/715 |
| 6,308,654 | B1 | 10/2001 | Schneider et al. | |
| 6,309,465 | B1 | 10/2001 | Jurgensen et al. | |
| 6,349,270 | B1 | 2/2002 | Gurary et al. | |
| 6,368,404 | B1 | 4/2002 | Gurary et al. | |
| 6,375,750 | B1 * | 4/2002 | van Os et al. | 118/728 |
| 6,432,259 | B1 | 8/2002 | Noorbakhsh et al. | |
| 6,444,263 | B1 | 9/2002 | Paranjpe et al. | |
| 6,492,625 | B1 | 12/2002 | Boguslavskiy et al. | |
| 6,506,450 | B2 | 1/2003 | Jurgensen et al. | |
| 6,530,992 | B1 | 3/2003 | Yang et al. | |
| 6,533,867 | B2 | 3/2003 | Doppelhammer | |
| 6,547,876 | B2 | 4/2003 | Ferguson et al. | |
| 6,548,112 | B1 | 4/2003 | Hillman et al. | |
| 6,596,133 | B1 | 7/2003 | Moslehi et al. | |
| 6,660,096 | B2 | 12/2003 | Takeshita et al. | |
| 6,685,774 | B2 | 2/2004 | Boguslavskiy et al. | |
| 6,709,523 | B1 | 3/2004 | Toshima et al. | |
| 6,726,769 | B2 | 4/2004 | Boguslavskiy et al. | |
| 6,776,874 | B2 | 8/2004 | Kobayashi et al. | |
| 6,786,973 | B2 | 9/2004 | Strauch et al. | |
| 6,800,139 | B1 | 10/2004 | Shinriki et al. | |
| 6,811,614 | B2 | 11/2004 | Kappeler et al. | |
| 6,849,241 | B2 | 2/2005 | Dauelsberg et al. | |
| 6,886,491 | B2 | 5/2005 | Kim et al. | |
| 6,902,623 | B2 | 6/2005 | Gurary et al. | |
| 6,908,838 | B2 | 6/2005 | Strzyzewski | |
| 6,916,398 | B2 * | 7/2005 | Chen et al. | 156/345.33 |
| 6,964,876 | B2 | 11/2005 | Heuken | |
| 7,078,318 | B2 | 7/2006 | Jurgensen et al. | |
| 7,128,785 | B2 | 10/2006 | Kaeppeler et al. | |
| 7,128,786 | B2 | 10/2006 | Jurgensen et al. | |
| 7,135,073 | B2 | 11/2006 | Heuken et al. | |
| 7,147,718 | B2 | 12/2006 | Jurgensen et al. | |
| 7,204,886 | B2 * | 4/2007 | Chen et al. | 118/715 |
| 7,228,873 | B2 * | 6/2007 | Ku et al. | 137/624.11 |
| 7,235,139 | B2 | 6/2007 | Boguslavskiy et al. | |
| 7,252,716 | B2 * | 8/2007 | Kim et al. | 118/715 |
| 7,255,898 | B2 | 8/2007 | O'Donnell et al. | |
| 7,275,861 | B2 | 10/2007 | Volf et al. | |
| 7,294,207 | B2 * | 11/2007 | Strauch et al. | 118/715 |
| 7,368,368 | B2 | 5/2008 | Emerson | |
| 7,402,210 | B2 * | 7/2008 | Chen et al. | 118/715 |
| 7,410,670 | B2 | 8/2008 | Schumacher et al. | |
| 7,422,637 | B2 * | 9/2008 | Ku et al. | 118/728 |
| 7,473,316 | B1 | 1/2009 | Schottker et al. | |
| 7,524,532 | B2 | 4/2009 | Jurgensen et al. | |
| 7,591,907 | B2 * | 9/2009 | Chen et al. | 118/715 |
| 7,625,448 | B2 | 12/2009 | Dauelsberg et al. | |
| 7,645,342 | B2 | 1/2010 | Emerson et al. | |
| 7,699,023 | B2 * | 4/2010 | Chen et al. | 118/723 VE |
| 7,709,398 | B2 | 5/2010 | Strauch et al. | |
| 7,722,719 | B2 * | 5/2010 | Lei et al. | 118/715 |
| 7,732,308 | B2 | 6/2010 | Schumacher et al. | |
| 7,740,706 | B2 * | 6/2010 | Park et al. | 118/715 |
| 7,758,698 | B2 * | 7/2010 | Bang et al. | 118/715 |
| 7,762,208 | B2 | 7/2010 | Juergensen et al. | |
| 7,780,785 | B2 * | 8/2010 | Chen et al. | 118/715 |
| 7,780,788 | B2 * | 8/2010 | Chen et al. | 118/715 |
| 7,794,544 | B2 * | 9/2010 | Nguyen et al. | 118/715 |
| 7,799,704 | B2 * | 9/2010 | Park et al. | 438/778 |
| 7,850,779 | B2 * | 12/2010 | Ma et al. | 118/715 |
| 7,964,151 | B2 * | 6/2011 | Jeon | 422/129 |
| 7,976,631 | B2 | 7/2011 | Burrows et al. | |
| 8,052,796 | B2 | 11/2011 | Mullins et al. | |
| 8,070,879 | B2 * | 12/2011 | Chen et al. | 118/715 |
| 8,152,924 | B2 | 4/2012 | Dauelsberg et al. | |
| 8,157,915 | B2 | 4/2012 | Dauelsberg et al. | |
| 8,211,230 | B2 * | 7/2012 | Verghese et al. | 118/715 |
| 8,216,419 | B2 | 7/2012 | Moshtagh et al. | |
| 8,231,940 | B2 | 7/2012 | Boguslavskiy et al. | |
| 8,268,078 | B2 * | 9/2012 | Suzuki et al. | 118/715 |
| 8,282,735 | B2 * | 10/2012 | Choi et al. | 118/715 |
| 8,282,992 | B2 * | 10/2012 | Myo et al. | 427/248.1 |
| 8,287,646 | B2 | 10/2012 | Mitrovic et al. | |
| 8,298,336 | B2 * | 10/2012 | Wang et al. | 118/715 |
| 8,298,337 | B2 | 10/2012 | Reinhold et al. | |
| 8,343,279 | B2 * | 1/2013 | Myo et al. | 118/724 |
| 8,349,081 | B2 | 1/2013 | Reinhold et al. | |
| 8,372,204 | B2 | 2/2013 | Nakamura et al. | |
| 8,460,466 | B2 | 6/2013 | Gurary | |
| 2003/0019428 | A1 * | 1/2003 | Ku et al. | 118/715 |
| 2003/0079686 | A1 * | 5/2003 | Chen et al. | 118/715 |
| 2003/0082307 | A1 * | 5/2003 | Chung et al. | 427/402 |
| 2003/0108674 | A1 * | 6/2003 | Chung et al. | 427/255.394 |
| 2003/0121608 | A1 * | 7/2003 | Chen et al. | 156/345.33 |
| 2003/0124262 | A1 * | 7/2003 | Chen et al. | 427/404 |
| 2003/0129308 | A1 * | 7/2003 | Chen et al. | 427/255.28 |
| 2003/0177977 | A1 * | 9/2003 | Strauch et al. | 117/84 |
| 2003/0198740 | A1 * | 10/2003 | Wendling | 427/248.1 |
| 2003/0203616 | A1 * | 10/2003 | Chung et al. | 438/627 |
| 2004/0009336 | A1 * | 1/2004 | Marcadal et al. | 428/210 |
| 2004/0256351 | A1 * | 12/2004 | Chung et al. | 216/13 |
| 2004/0261704 | A1 | 12/2004 | Heuken et al. | |
| 2004/0266175 | A1 * | 12/2004 | Chen et al. | 438/629 |
| 2005/0009325 | A1 * | 1/2005 | Chung et al. | 438/637 |
| 2005/0173068 | A1 * | 8/2005 | Chen et al. | 156/345.33 |
| 2006/0272578 | A1 | 12/2006 | Mullins et al. | |
| 2007/0003698 | A1 * | 1/2007 | Chen et al. | 427/248.1 |
| 2007/0044719 | A1 * | 3/2007 | Ku et al. | 118/728 |
| 2007/0134419 | A1 | 6/2007 | Mitrovic et al. | |
| 2007/0254100 | A1 | 11/2007 | Nijhawan | |
| 2008/0069953 | A1 | 3/2008 | Dauelsberg | |
| 2008/0102199 | A1 | 5/2008 | Gurary | |
| 2008/0206464 | A1 | 8/2008 | Käppeler | |
| 2008/0274299 | A1 * | 11/2008 | Chen et al. | 427/569 |
| 2010/0003405 | A1 | 1/2010 | Kaeppeler | |
| 2010/0273320 | A1 | 10/2010 | Käppeler et al. | |
| 2011/0126761 | A1 * | 6/2011 | Lee et al. | 118/719 |
| 2011/0215071 | A1 * | 9/2011 | Mitrovic et al. | 216/37 |
| 2011/0259879 | A1 | 10/2011 | Hanawa et al. | |
| 2012/0003389 | A1 | 1/2012 | Brien et al. | |
| 2012/0003822 | A1 | 1/2012 | Ueno et al. | |
| 2012/0083060 | A1 | 4/2012 | Cui et al. | |
| 2012/0094474 | A1 | 4/2012 | Strauch | |
| 2012/0111271 | A1 * | 5/2012 | Begarney et al. | 118/724 |
| 2012/0118234 | A1 | 5/2012 | Ueno et al. | |
| 2012/0272892 | A1 | 11/2012 | Paranjpe et al. | |
| 2012/0304926 | A1 | 12/2012 | Boguslavskiy et al. | |
| 2013/0005118 | A1 | 1/2013 | Jun et al. | |

(56) References Cited

U.S. PATENT DOCUMENTS

| | | |
|---|---|---|
| 2013/0040054 A1 | 2/2013 | Strauch et al. |
| 2013/0061805 A1 | 3/2013 | Jin et al. |
| 2013/0125820 A1 | 5/2013 | Yin et al. |

FOREIGN PATENT DOCUMENTS

| | | |
|---|---|---|
| DE | 102005055468 A1 | 5/2007 |
| EP | 0687749 B1 | 9/1998 |
| EP | 0975821 A1 | 2/2000 |
| EP | 1504463 A1 | 2/2005 |
| EP | 2441085 A2 | 4/2012 |
| EP | 2543063 A2 | 1/2013 |
| EP | 2553140 A1 | 2/2013 |
| JP | 2000-114184 A | 4/2000 |
| JP | 2000114184 A | 4/2000 |
| JP | 2002-235173 | 8/2002 |
| JP | 2002235173 A | 8/2002 |
| TW | 200728495 A | 8/2007 |
| WO | WO 99/42636 | 8/1999 |
| WO | WO 2001007691 A1 | 2/2001 |
| WO | WO 03/098667 A1 | 11/2003 |
| WO | WO 2005/054537 A2 | 6/2005 |
| WO | WO 2006020424 A2 | 2/2006 |
| WO | WO 2008024932 A2 | 2/2008 |
| WO | WO 2009075747 A1 | 6/2009 |
| WO | WO 2009099776 A1 | 8/2009 |
| WO | WO 2010024943 A2 | 3/2010 |
| WO | WO 2010040011 A2 | 4/2010 |
| WO | WO 2010054184 A2 | 5/2010 |
| WO | WO 2010024943 A3 | 6/2010 |
| WO | WO 2010040011 A3 | 7/2010 |
| WO | WO 2010054184 A3 | 7/2010 |
| WO | WO 2010129183 A2 | 11/2010 |
| WO | WO 2010129289 A2 | 11/2010 |
| WO | WO 2010129292 A2 | 11/2010 |
| WO | WO 2010/144302 A2 | 12/2010 |
| WO | WO 2010129183 A3 | 1/2011 |
| WO | WO 2010129289 A3 | 2/2011 |
| WO | WO 2011068660 A2 | 6/2011 |
| WO | WO 2011/109348 A2 | 9/2011 |
| WO | WO 2011/117064 A1 | 9/2011 |
| WO | WO 2011068660 A3 | 9/2011 |
| WO | WO 2011106064 A1 | 9/2011 |
| WO | WO 2012003715 A1 | 1/2012 |
| WO | WO 2012022111 A1 | 2/2012 |
| WO | WO 2012033639 A1 | 3/2012 |
| WO | WO 2012071929 A1 | 6/2012 |
| WO | WO 2012079467 A1 | 6/2012 |
| WO | WO 2012079485 A1 | 6/2012 |
| WO | WO 2012083846 A1 | 6/2012 |
| WO | WO 2012092008 A1 | 7/2012 |
| WO | WO 2012092127 A1 | 7/2012 |
| WO | WO 2012136052 A1 | 10/2012 |
| WO | WO 2012151830 A1 | 11/2012 |
| WO | WO 2012167565 A1 | 12/2012 |
| WO | WO 2013012549 A2 | 1/2013 |
| WO | WO 2013029500 A1 | 3/2013 |
| WO | WO 2013033315 A2 | 3/2013 |
| WO | WO 2013033428 A2 | 3/2013 |
| WO | WO 2013033315 A3 | 5/2013 |

OTHER PUBLICATIONS

European Search Report for related Application EP 08 837 292.5 mailed Oct. 10, 2012.
English Language Abstract for JP 2000-114184 A, Apr. 21, 2000.
English Language Abstract for JP 2000-114184 A Apr. 21, 2000.

* cited by examiner

CHEMICAL VAPOR DEPOSITION REACTOR

CROSS REFERENCE TO RELATED APPLICATION

This application claims the benefit of U.S. Provisional Patent Application No. 60/979,181, filed Oct. 11, 2007, the entirety of which is hereby incorporated by reference into this application.

FIELD OF THE INVENTION

The invention pertains to chemical vapor deposition ("CVD") reactors, including metalorganic chemical vapor deposition ("MOCVD") reactors.

DESCRIPTION OF THE RELATED ART

Chemical vapor deposition ("CVD") reactors, and in particular metalorganic chemical vapor deposition ("MOCVD") reactors are used to deposit solid material layers onto a wafer. Such materials typically include compounds of the group III column and group V column elements of the periodic table (referred to as III-V material, but also include "II-VI materials" as well). Materials such as silicon (Si), silicon carbide (SiC), zinc oxide (ZnO) and others are also deposited on wafers or other surfaces using these reactors. Commercially, these reactors are used in the manufacture of solid-state (semiconductor) microelectronic devices, optical devices and photovoltaic (solar) devices, and other electronic/opto-electronic materials and devices.

In operation, typically a flat-cylindrical wafer carrier with one or more wafers loaded in shallow pockets on the upper surface of the wafer carrier is heated to the required temperature (450-1400° C.) by a heater assembly located (typically) below the lower surface.

A continuously-supplied gas mixture is directed to flow over the surface of the heated wafer carrier and wafers. The gas mixture is predominantly (about 75-95%) a carrier gas, which is an appropriate inert gas (typically hydrogen or nitrogen) that functions to define the general flow pattern in the reactor and to appropriately dilute the reactant gases. The remainder of the gas mixture is comprised of group V reactant gases (about 4-23%), group III reactant vapors (about 1-2%), and dopant gases or vapors (trace levels).

The group V gases decompose immediately above and on the surface of the heated wafer carrier and wafers, allowing atoms of the central group V element to incorporate into the material layer being deposited (both on the wafers and on the surface of the wafer carrier). The group III gases similarly decompose to provide atoms of the group III element. The dopant gases similarly decompose to provide atoms which function to alter the electrical conductivity characteristics of the semiconductor material.

After flowing radially outward over the surface of the wafer carrier and wafers, the gas mixture (now also containing reactant by-products) exits the reactor through one or more exhaust ports. A vacuum pump is typically used to draw the gas mixture through the reactor, particularly because most materials deposit optimally at pressures lower than atmospheric pressure. After passing over the heated wafer carrier, the gas mixture begins to cool rapidly, which results in rapid condensation of byproducts into the solid state. These tend to coat the interior surfaces of the reactor chamber (below the wafer carrier) and exhaust tubing.

The wafer carrier is typically rotated from 100 to over 1000 RPM to aid in uniformly distributing the flowing gas mixture, and to reduce the thickness of the mass-transport boundary layer, which increases the efficiency of reactant usage as well as byproduct removal.

Material is deposited using this method in batches. The reactants are not supplied continuously during the batch run. The typical batch run is conducted as follows. During the initial stage of the run, only the carrier gas is supplied at a low flowrate. Then, in unison, the wafer carrier rotation is gradually increased to the desired value, the wafer carrier temperature is increased to the desired value, and the carrier gas flowrate is increased to the desired value. The group V reactant gas is typically switched into the reactor first (at a specific temperature level) to stabilize the surface of the substrate wafers (prevent desorption of group V atoms), and then the group III and dopant gases are switched in to effect "growth" of material layers (material growth only occurs when at least one group V and at least one group III source are switched to the reactor). Brief pauses where no group III or dopant gases are supplied to the reactor may occur, but at least one group V gas is typically supplied during the entire growth stage (while temperature is above about 350-400° C.).

Once all material layers have been grown, the temperature is gradually decreased. Once the temperature is below about 350° C., the group V reactant gas is switched off, and the rotation, temperature and carrier gas flowrate are decreased to the starting levels. The wafers are then removed from the wafer carrier, either by opening the reactor chamber top or by transfer of the entire wafer carrier out of the reactor chamber by mechanical means. Depending on the material being deposited, the same wafer carrier may be used for many batch runs, or for only one run, before the excess material deposited on the exposed top surface must be cleaned off.

There are a number of known MOCVD reactor systems used in the market currently. Each of these known MOCVD reactors suffers from deficiencies and disadvantages.

One design uses a tall cylindrical vessel with a gas flow injection top lid that attempts to spread flow evenly over the entire lid area. To a limited extent, the vertical separation prevents byproduct material deposition on the internal lid surface through which the gas flows enter. The lid design, however, has disadvantages that include: ineffective isolation of the multiple gas spreading "zones" in the lid, resulting in pre-reaction and byproduct material deposition; ineffective spreading of gas flows over the large zone areas from supply gas tubes, resulting in non-optimal material characteristics as well as additional material deposition on the internal lid surface; and the high flowrates of gas required to produce a relatively uniform outlet flow from the lid through the large chamber volume.

A second design uses a short cylindrical vessel with a gas flow injection top lid that is closely spaced to the (heated) deposition surface. The close spacing is effective in minimizing the reactor volume and providing effective contacting of the gas to the deposition surface, and the gas chamber isolation is effective. However, the close spacing results in byproduct material deposition on the internal lid surface and requires cleaning after nearly every process run, which requires greater maintenance time and costs and less productive time. In addition to high maintenance costs, the cost to manufacture the top lid is very high due to the complexity of the lid and the large area.

Both designs are expensive to use. The first design has a very high operating cost and produces a product of lower quality and performance. The second design has a relatively lower operating cost, but higher system maintenance requirements.

A CVD reactor system that has a lower production price and operating costs is desirable. A CVD reactor system with improved characteristics of deposited material, high uptime and high quality is desirable.

SUMMARY OF THE INVENTION

A CVD reactor, such as a MOCVD reactor conducting metalorganic chemical vapor deposition of epitaxial layers, is provided. The CVD or MOCVD reactor generally comprises one or more of a flow flange assembly, adjustable proportional flow injector assembly, a chamber assembly, and a multi-segment center rotation shaft.

The CVD reactor provides a novel geometry to specific components that function to reduce the gas usage while also improving the performance of the deposition. In one aspect, a number of CVD reactor components with novel geometries are described. In another aspect, new components are described that address the problems of conventional CVD reactors. For example, the chamber top and side wall has a geometry that is significantly different from conventional components. The top and side walls form a flared or curved conical surface. The exit region of the reactor also has an improved geometry that includes a tapered or sloped surface. A novel gas injector is included in one embodiment of the invention to further improve on performance and economy.

The inventive design provides a number of advantages. The CVD reactor reduces the volume of the reactor, provides a flow-guiding surface which directs entering gas flows to intimately contact a deposition surface, provides an additional flow-guiding surface to prevent back-entry of spent reaction gas into the main reaction volume, provides highly uniform fluid cooling or temperature control of key internal reactor surface, and provides means of reducing heat losses from the deposition surface.

The reactor design addresses a number of the problems with existing designs including but not limited to the following: (1) high/inefficient gas and chemicals usage, (2) non-uniform distribution of entering gas flows, (3) high manufacturing costs of equipment, and (4) deposition of problematic byproduct materials on internal reactor surfaces. The result is advantages of lower operating cost, improved characteristics of deposited material layers, and lower machine maintenance requirements.

The flow flange assembly comprises a three-dimensional tapered or flared cone upper surface and thin fluid gap immediately behind the surface, in contrast to vertical cylindrical walls of other designs. The design reduces reactor volume and gas usage, effectively guides gas towards deposition surface for more efficient chemicals usage, and provides for approximately uniform radial velocity for improved deposition uniformity.

The adjustable proportional flow injector has several features including smaller area than deposition surface, isolated flow zones, a single adjustable flow zone with no separation barriers, and uniform cooling fluid flow profile. These features address several problems in prior art injectors by providing a lower gas flowrate, lower manufacturing cost, no zone cross leak and resulting pre-reaction and by-product material deposition, and improved uniformity of deposited material.

In one embodiment, the adjustable proportional flow injector assembly comprises one or more gas chambers for separately maintaining one or more reactant gas flows and a fluid cavity for regulation of gas temperature prior to injection of the gas into the reactor chamber. The adjustable proportional flow injector assembly receives one or more gas inlet streams from supply tubes and spreads/diffuses these flows for a uniform outlet flow velocity, while keeping the gas streams separated until they exit, and also regulating the temperature of the gas as the gas exits the adjustable proportional flow injector assembly.

In one embodiment, the chamber assembly generally comprises a conical or sloped lower flow guide. The lower flow guide prevents gas recirculation back into the reaction zone, improves smoothness of flow from the outer edge of the wafer carrier into the exhaust ports for a more stable overall reactor flow profile, reduces heat losses at the outer edge of the wafer carrier for better temperature uniformity and improved material characteristics.

An embodiment of the wafer carrier has a cylindrical plate made of high temperature resistant material that holds the substrate wafer(s) within the reactor volume, and, in embodiments of the invention, transfers heat received from the heater assembly to the wafers. The center rotation shaft is generally in communication with the wafer carrier and causes rotational movement of the wafer carrier. In an embodiment, the center rotation shaft penetrates through the base plate center axis, usually in combination with a rotary vacuum feedthrough (such as a ferrofluid sealed type), and supports and rotates the wafer carrier within the reactor.

In a particular embodiment, the reactor comprises a two-piece wafer carrier having a top and a bottom, the top having properties optimal for holding substrate wafers and the bottom having properties optimal for heat absorption.

A multi-segment center rotation shaft is provided in one embodiment. The multi-segment shaft has two or more segments that may optionally be used in the reactor. At least one segment of the multi-segment shaft is made from a material having a low thermal conductivity. The multi-segment shaft may have segment interfaces designed to have a high thermal transfer resistance, to reduce thermal losses from the wafer carrier. The multi-segment shaft may generate additional heat near the center of the wafer carrier and provide a thermal barrier to heat losses from the wafter carrier and/or shaft.

BRIEF DESCRIPTION OF THE DRAWINGS

The following is a general description of the drawings filed herewith.

DETAILED DESCRIPTION OF THE INVENTION

The present invention is described in detail using preferred embodiments. The present invention, however, is not limited to these embodiments. Additionally, a requirement in an embodiment is freely applicable to other embodiments, and requirements are mutually replaceable unless special conditions are attached. Specifically, a CVD reactor or MOCVD reactor, and components and parts of the reactors, are described in further detail below. The CVD reactors or MOCVD reactors may comprise other components and parts which are not specifically mentioned herein. Further, it should be understood that the scope of the invention pertains to CVD reactors or MOCVD reactors which may comprise some of the components and parts discussed herein or may comprise all of the components and parts discussed herein.

Figure 1:
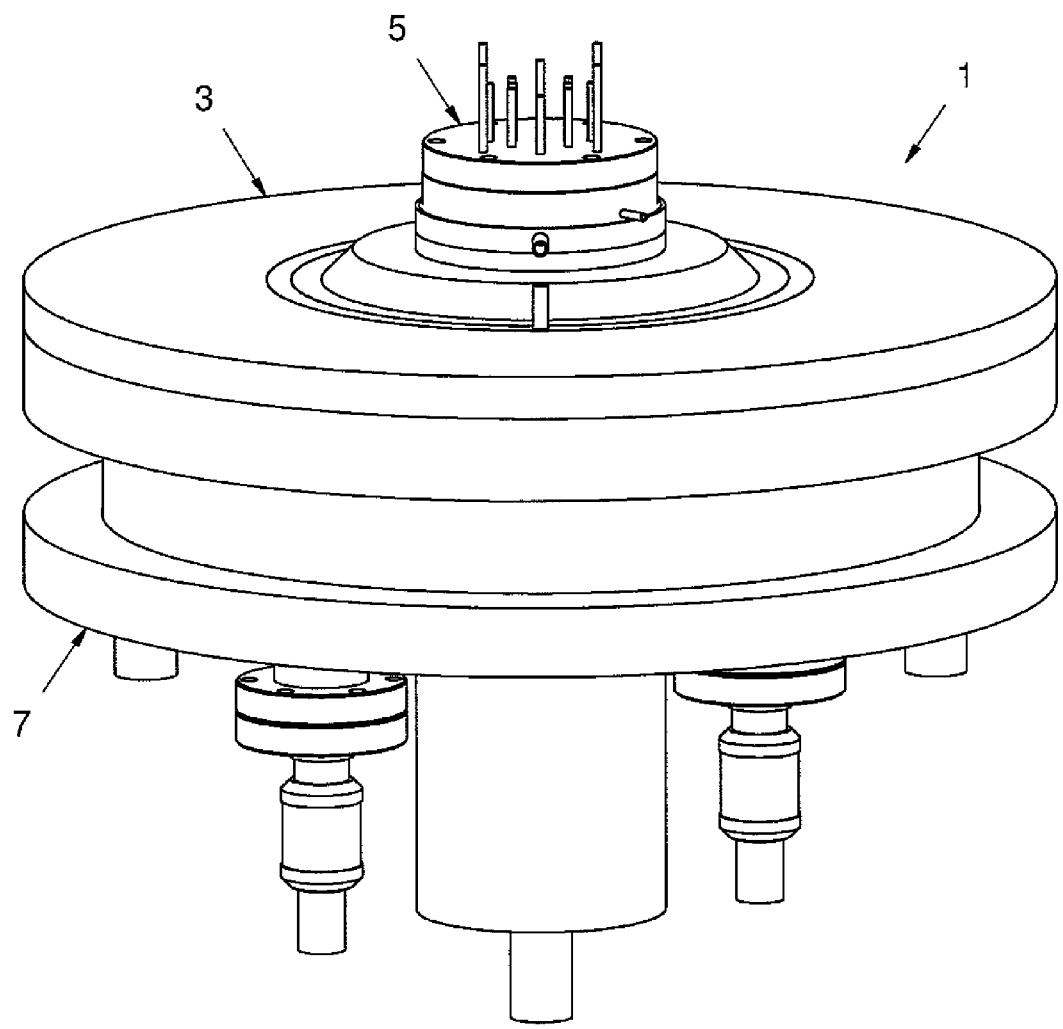
FIG. 1 is a perspective view of one embodiment of the entire reactor chamber assembly.
Figure 2:
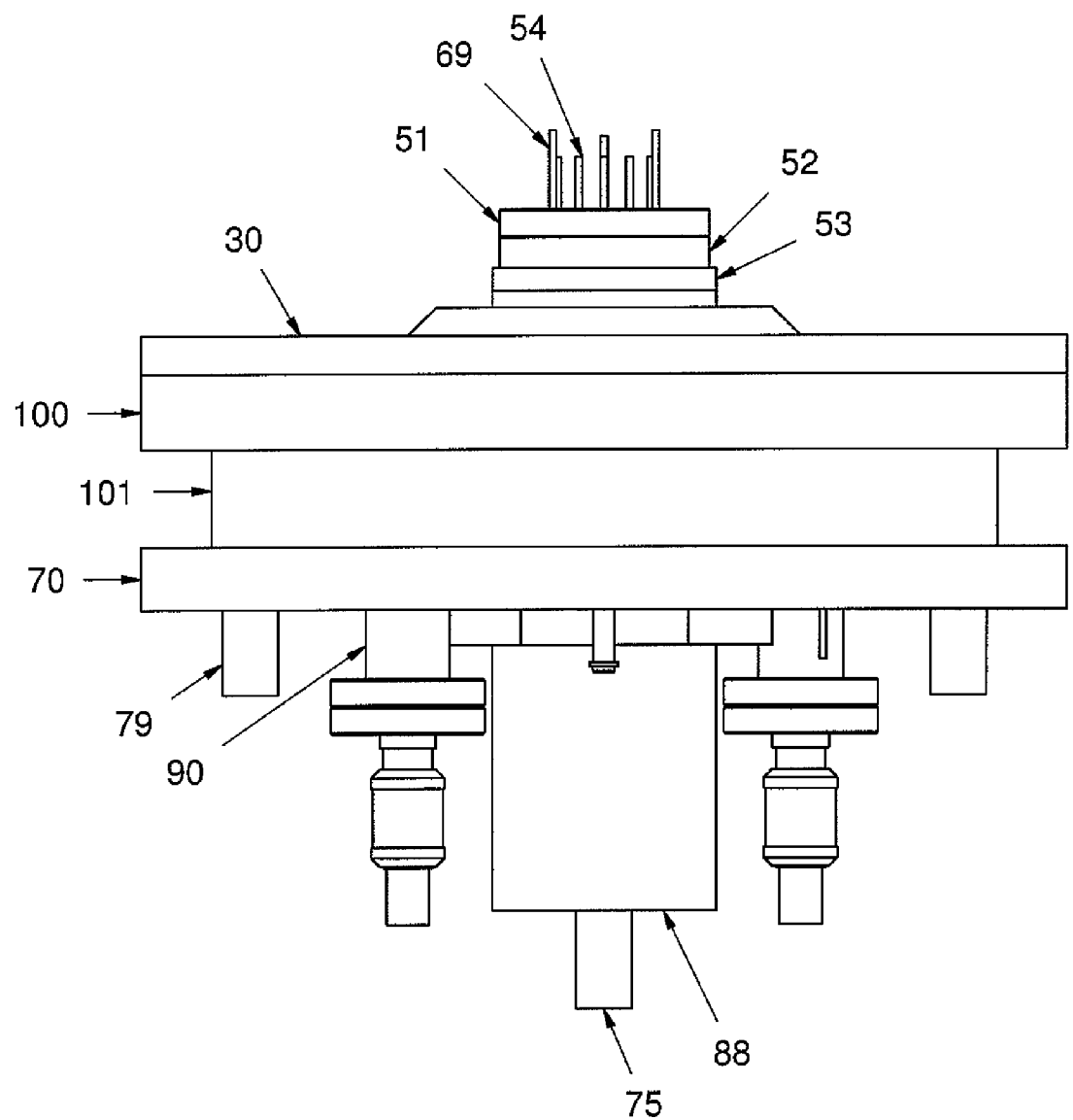
FIG. 2 is a side view of one embodiment of the entire reactor chamber assembly.

FIG. 1 illustrates a front perspective view of one embodiment of the entire reactor assembly 1. The entire reactor assembly 1 is comprised of three subassemblies that together form the entire reactor assembly 1. The three subassemblies are the flow flange assembly 3, the adjustable proportional flow injector assembly 5, and the chamber assembly 7. FIG. 2 illustrates a side view of the reactor assembly 1 as well as some of the individual components that are visible from the exterior of the reactor 1. Those components are discussed in more detail below.

Figure 3:
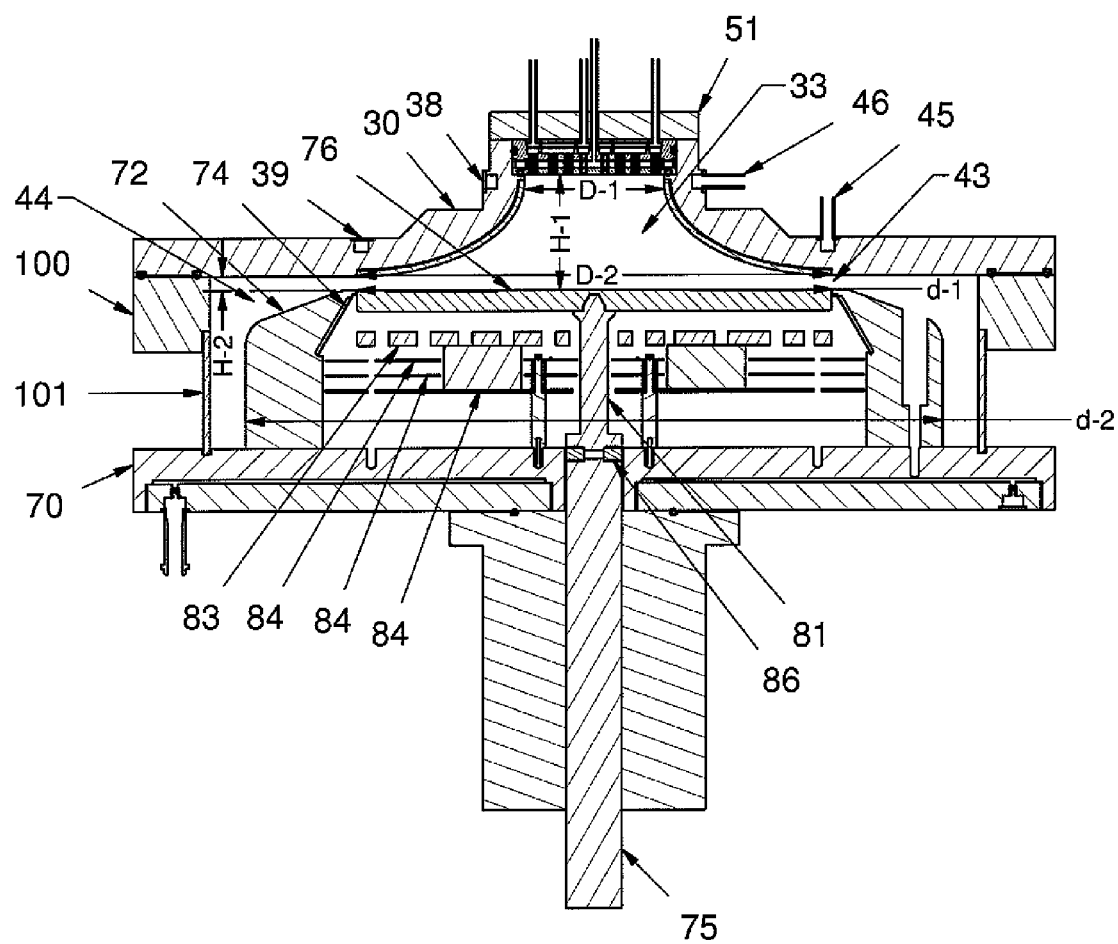
FIGS. 3-5 show cross-sectional views of one embodiment of the entire reactor chamber assembly.
Figure 4:
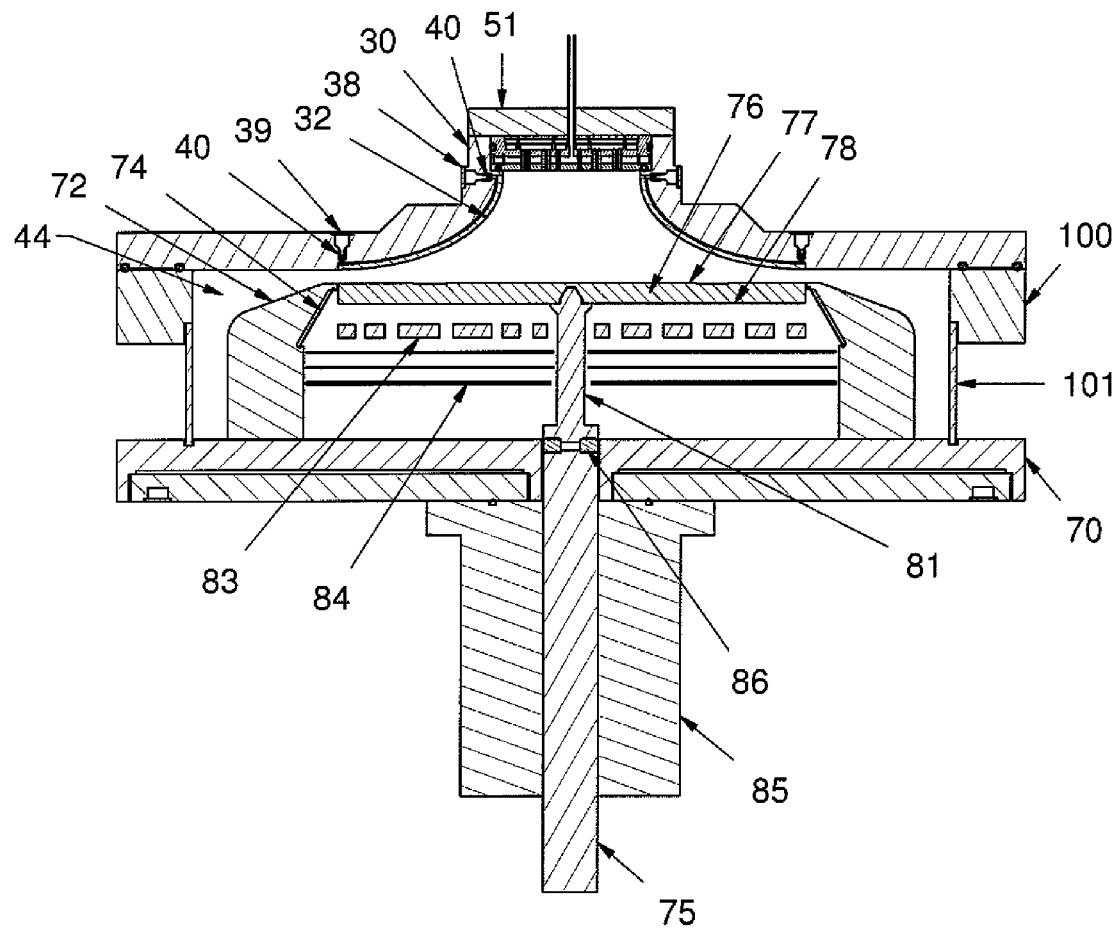
Figure 5:
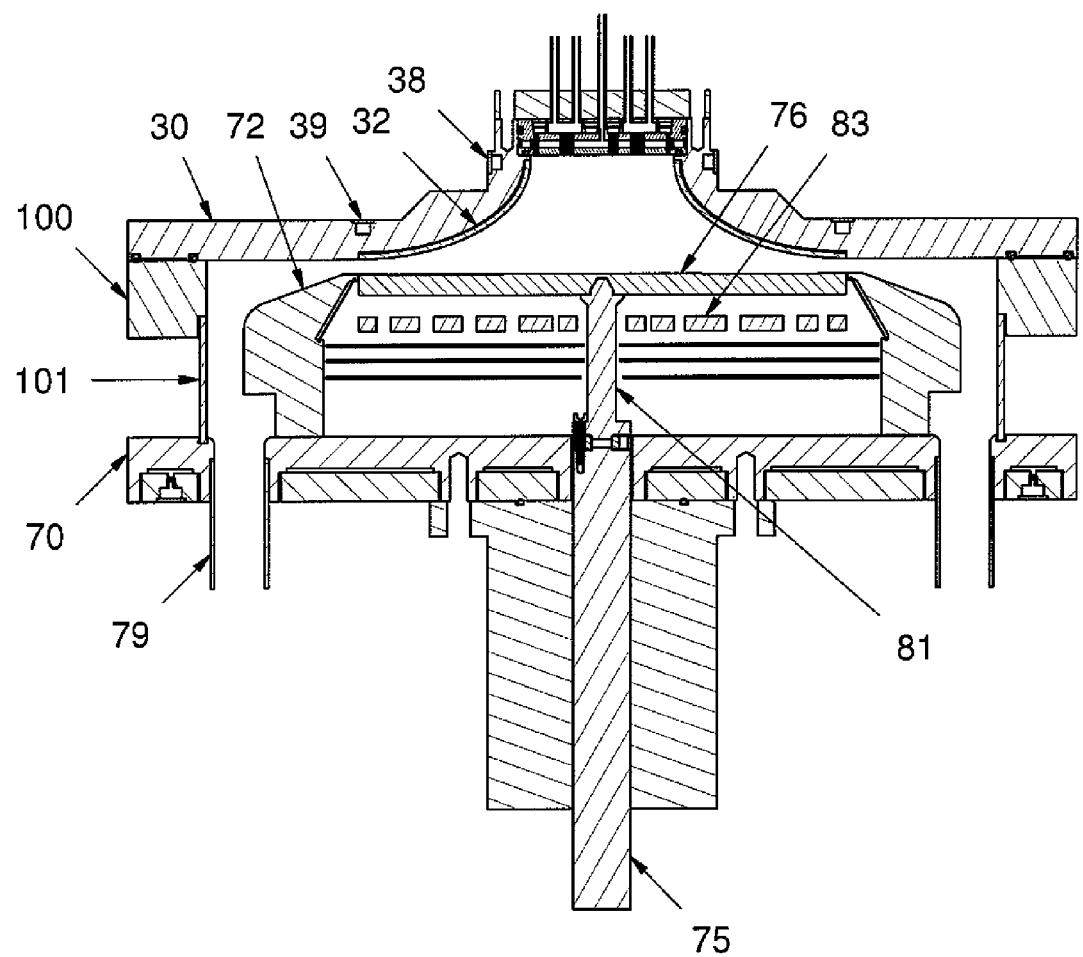
Figure 6:
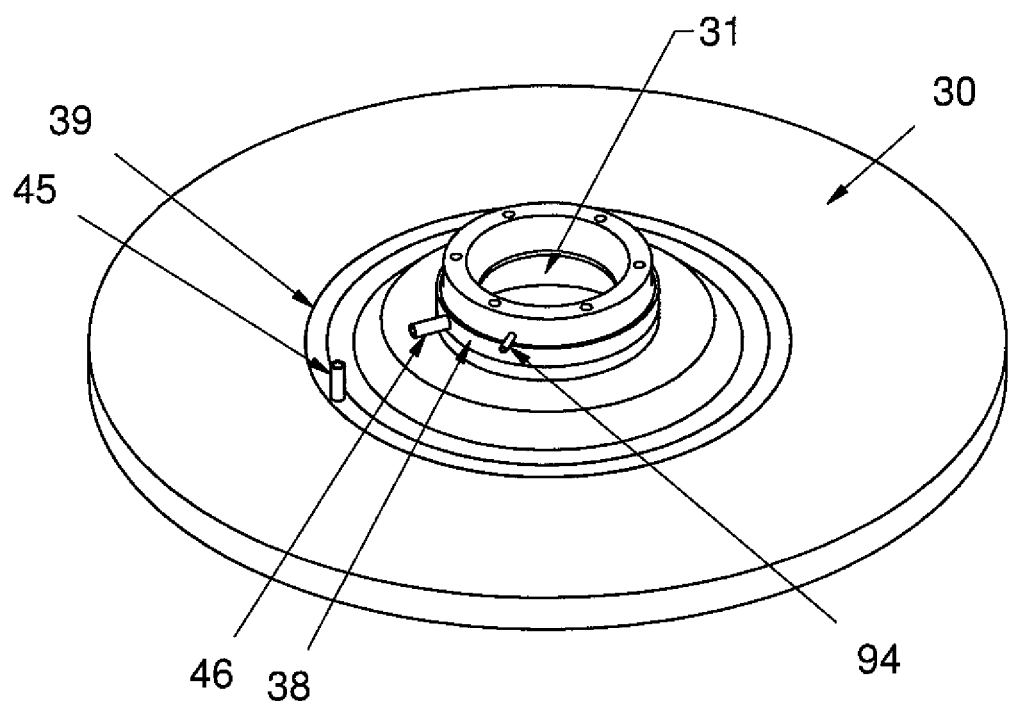
FIG. 6 shows a perspective view of one embodiment of the flow flange assembly.

FIGS. 3-5 illustrate a cross sectional view of the entire reactor assembly 1 showing the interconnection of the three subassemblies, and a cross-sectional view of the individual components that make up the three subassemblies. As in FIGS. 1 and 2, the flow flange assembly 3, the adjustable proportional flow injector assembly 5 and the chamber assembly 7 are illustrated. The individual components of the three subassemblies 3, 5, and 7 are also indicated and discussed in greater detail below.

FIGS. 6-10 and 18 show several views of one embodiment of flow flange assembly 3. The flow flange assembly 3 comprises a main flange body 30 and has an upper opening 31 which defines a mating port for the flow injector assembly 5 on the top and mates to the chamber assembly 7 on the bottom end (shown best in the cross section view of FIGS. 3-5.) The flow flange assembly 3 has an upper flow guide 32, which, along with the flow injector and wafer carrier, defines the reactor volume 33 and the gas flow profile within the reactor volume, fitted within the main flange body 30.

Figure 7:
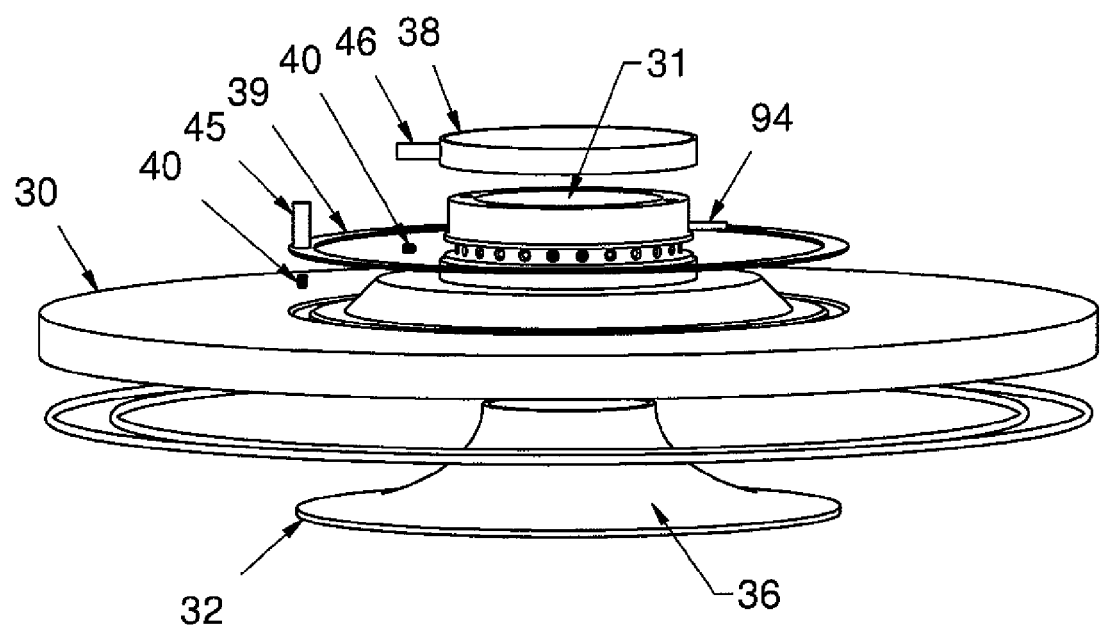
FIG. 7 shows an exploded side view of one embodiment of the flow flange assembly.
Figure 8:
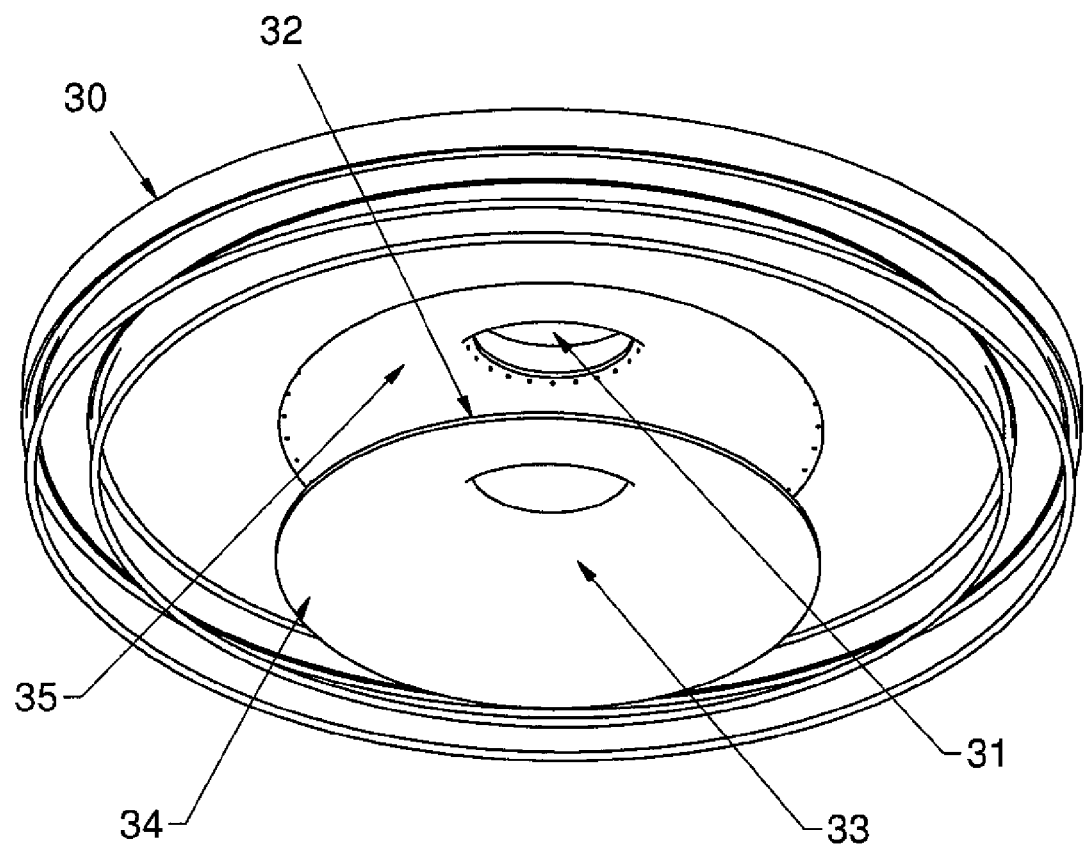
FIG. 8 shows an exploded underside view of an embodiment of flow flange assembly.
Figure 9A:
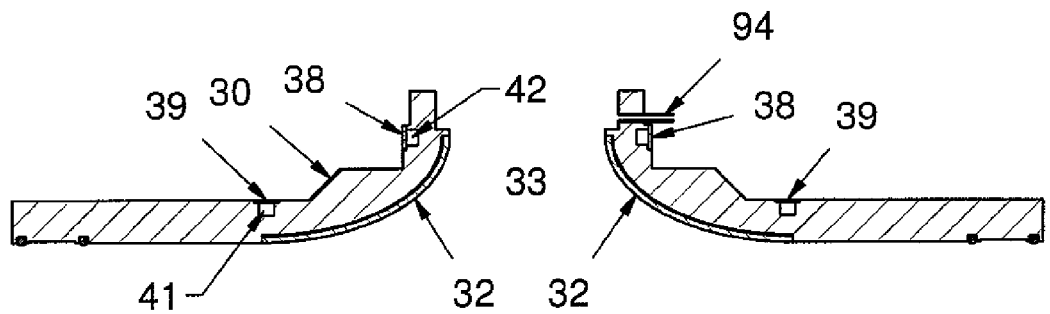
FIGS. 9a-c show three cross-sectional side views of an embodiment of the upper flow guide.
Figure 9B:
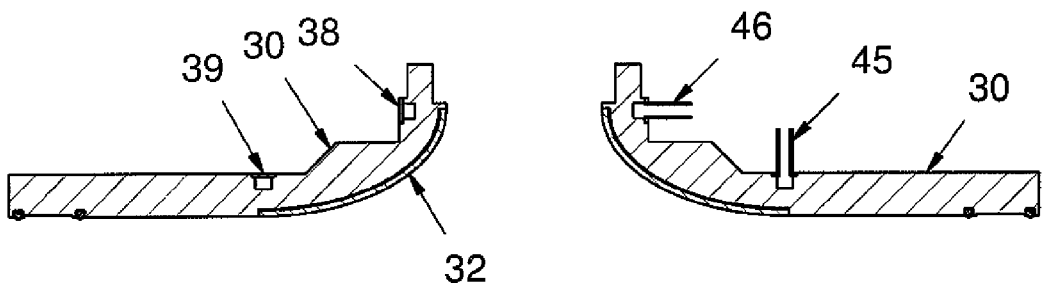
Figure 9C:
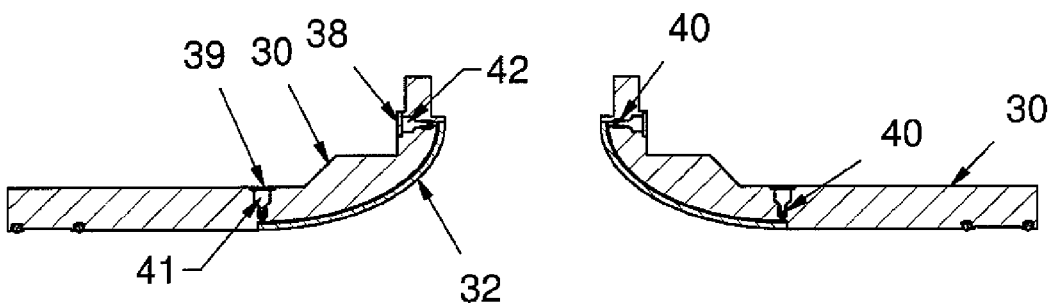
Figure 10:
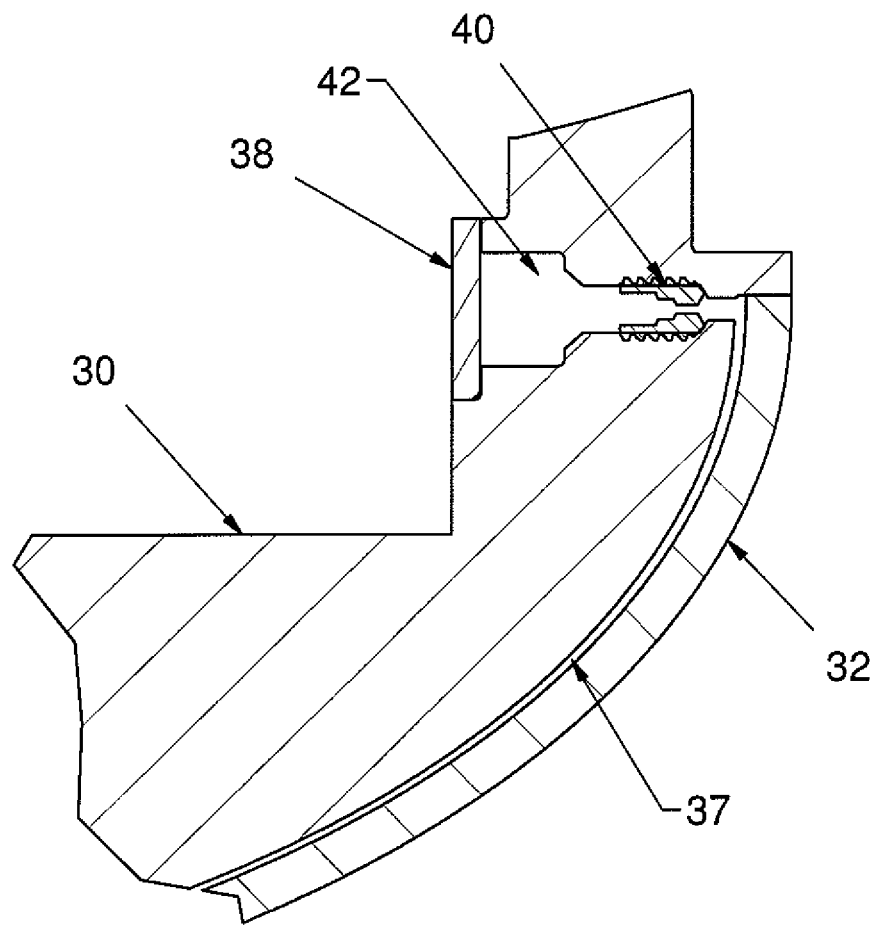
FIG. 10 shows a close up cross sectional view of an embodiment of the upper flow guide.
Figure 11:
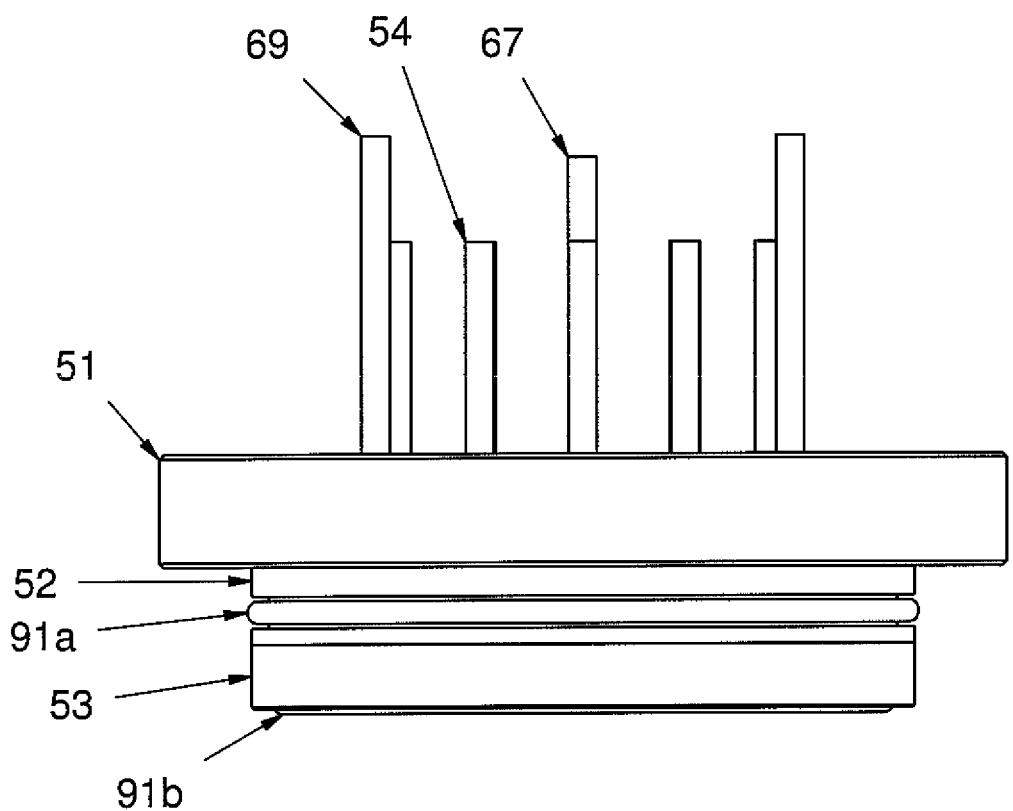
FIG. 11 shows a side view of an embodiment of the adjustable proportional flow injector assembly.
Figure 12:
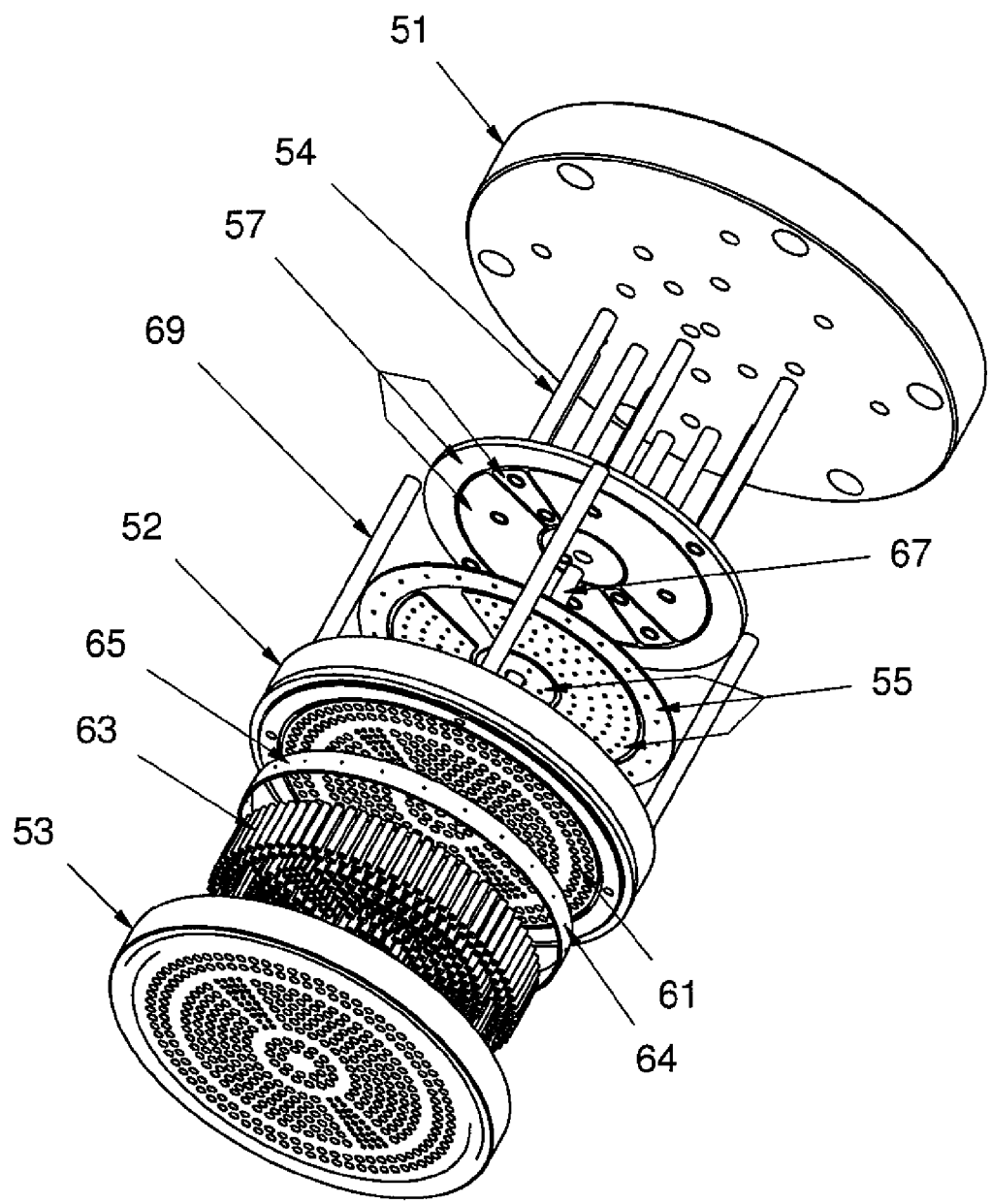
FIG. 12 shows an exploded side view of an embodiment of the adjustable proportional flow injector assembly.
Figure 13:
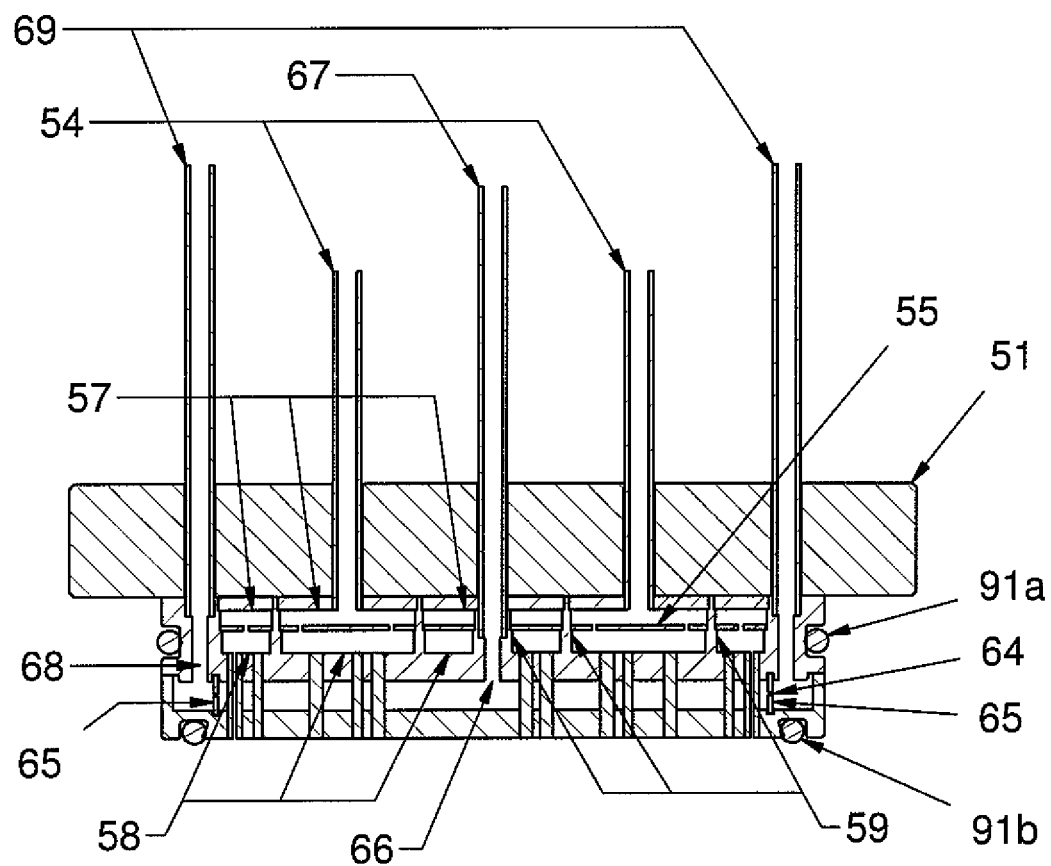
FIGS. 13-15 show three cross-sectional views of an embodiment of the adjustable proportional flow injector assembly.
Figure 14:
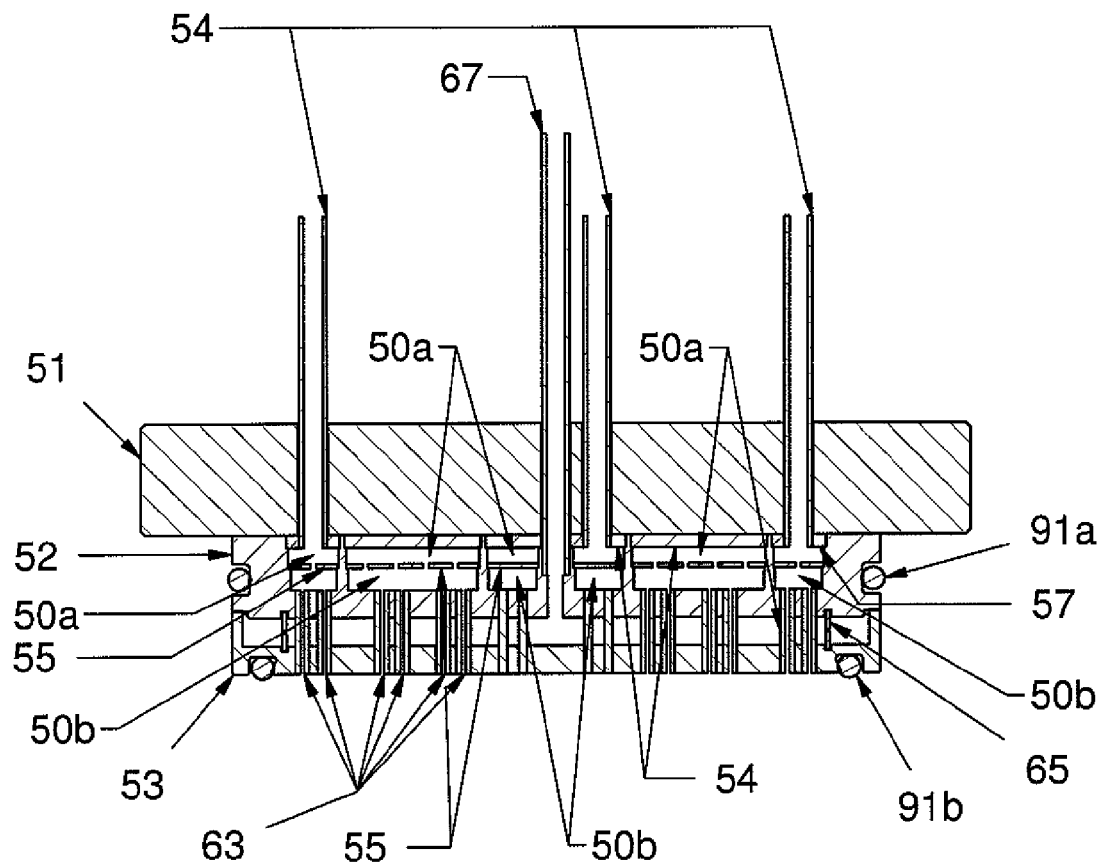
Figure 15:
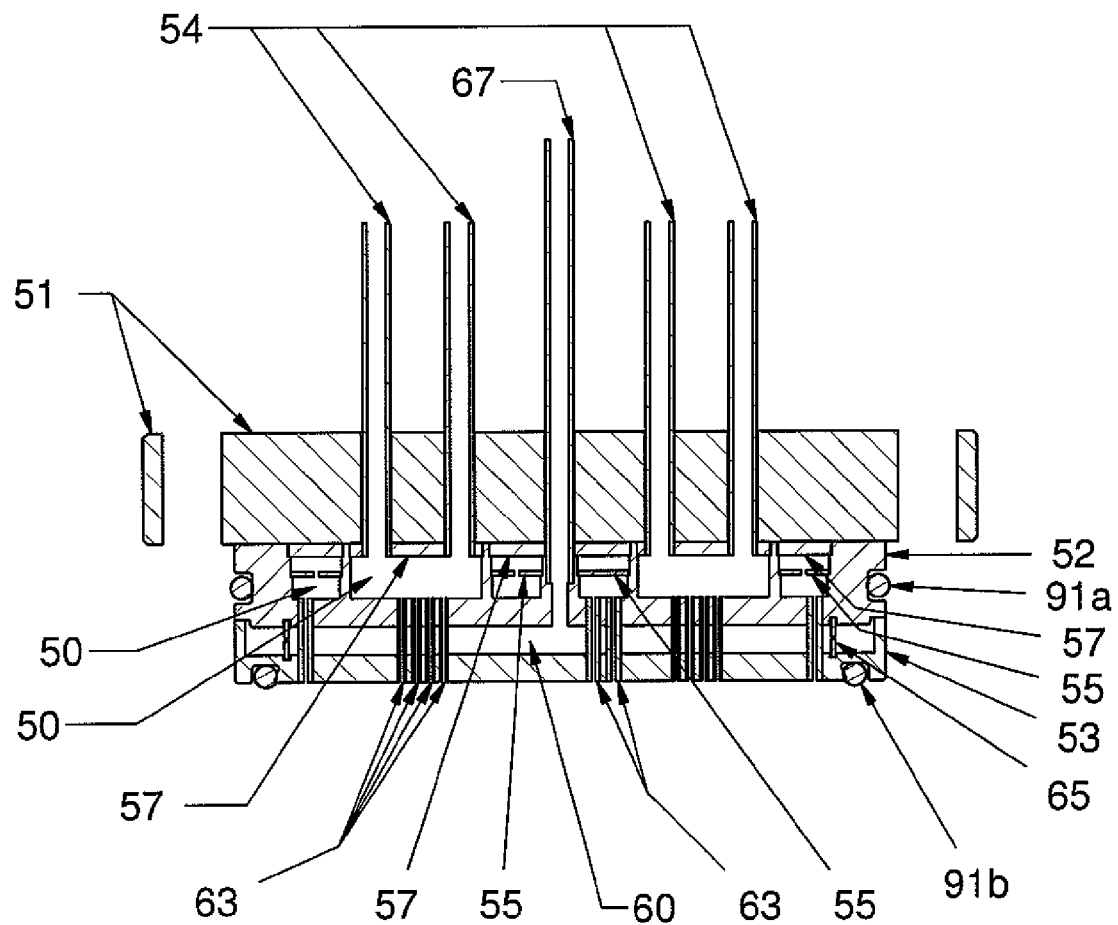

The upper flow guide 32 preferably has a three-dimensional tapered cone outward facing surface 34 (as opposed to vertical cylindrical walls of prior art designs). The upper flow guide 32 is positioned and fits within the main flange body 30 (as best shown in FIGS. 7 and 8. The underside 35 of the main flange body 30 has a corresponding shape to receive the inward facing surface 36 of the upper flow guide 32 so that a thin fluid gap or cavity 37 is formed immediately behind the upper flow guide 32, between the upper flow guide 32 and the main flange body 30 (best illustrated in FIGS. 8-10). In an embodiment, such as depicted in the FIGS. 9a-c, fluid cavity collection channels 41, 42 (two points here connect with the thin fluid cavity 37 through flow orifices 40.

The geometry of the upper flow guide 32 minimizes reactor chamber volume, suppresses recirculation eddies within the reactor chamber volume 33 and provides for efficient contacting of the reactant gas with the wafer carrier surface 77.

Figure 20:
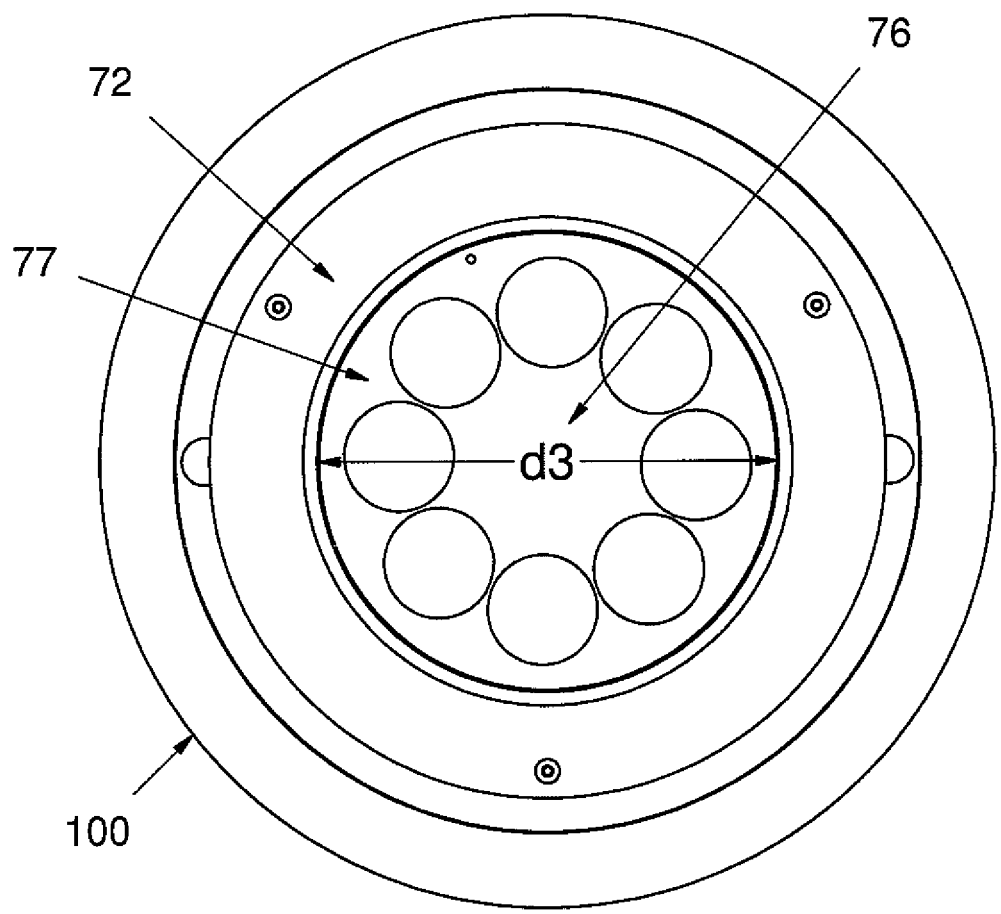
FIG. 20 shows a top view of an embodiment of the chamber assembly.
Figure 21A:
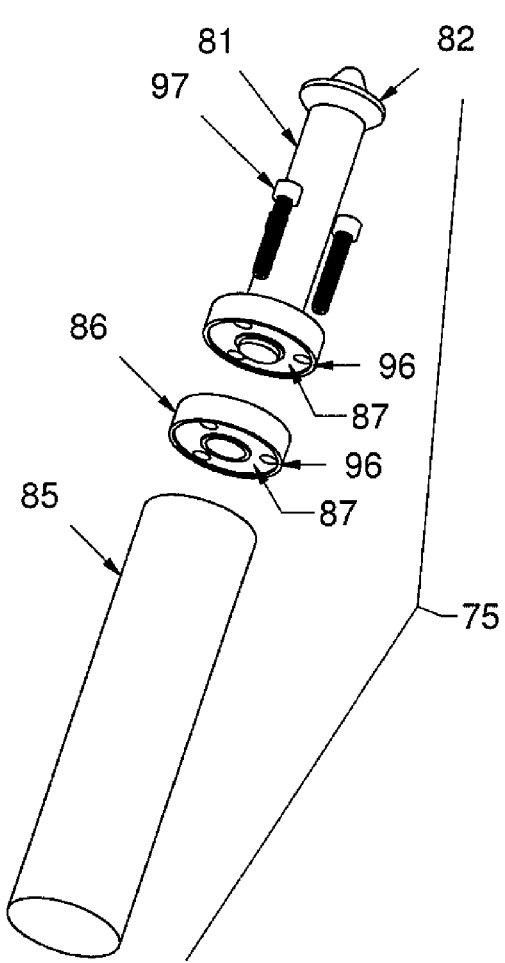
FIGS. 21a and 21b show two exploded views of an embodiment of the center rotation shaft assembly.
Figure 21B:
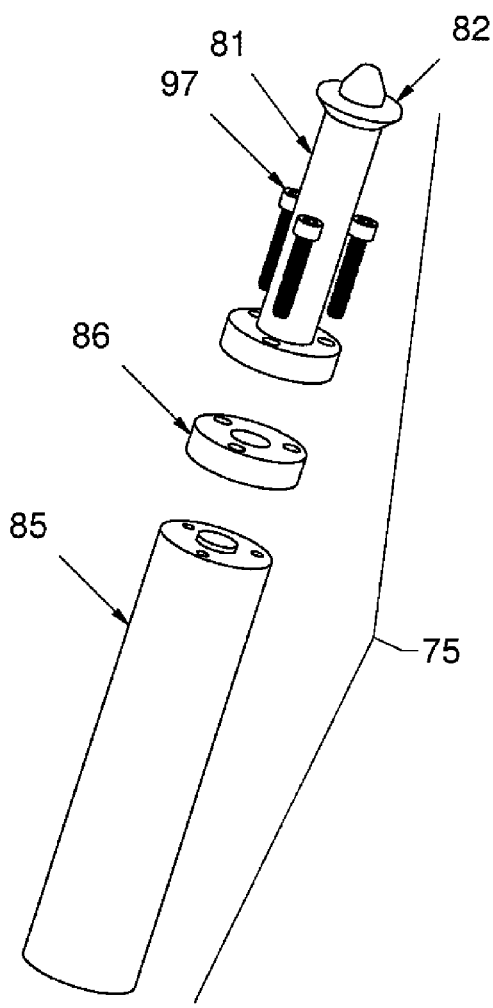
Figure 22:
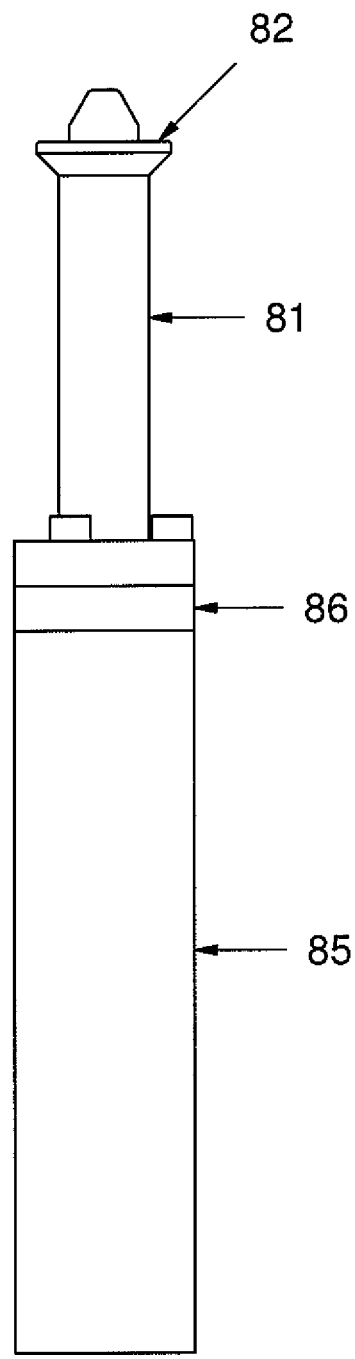
FIG. 22 shows a side view of an embodiment of the center rotation shaft assembly.
Figure 23:
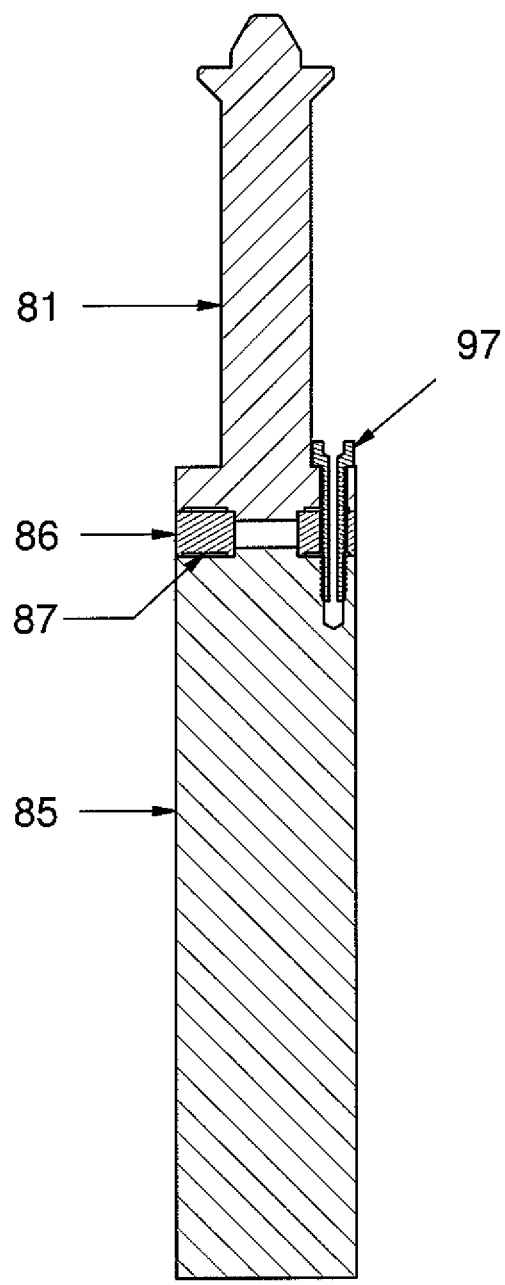
FIG. 23 shows a cross-sectional view of an embodiment of the center rotation shaft assembly.
Figure 24:
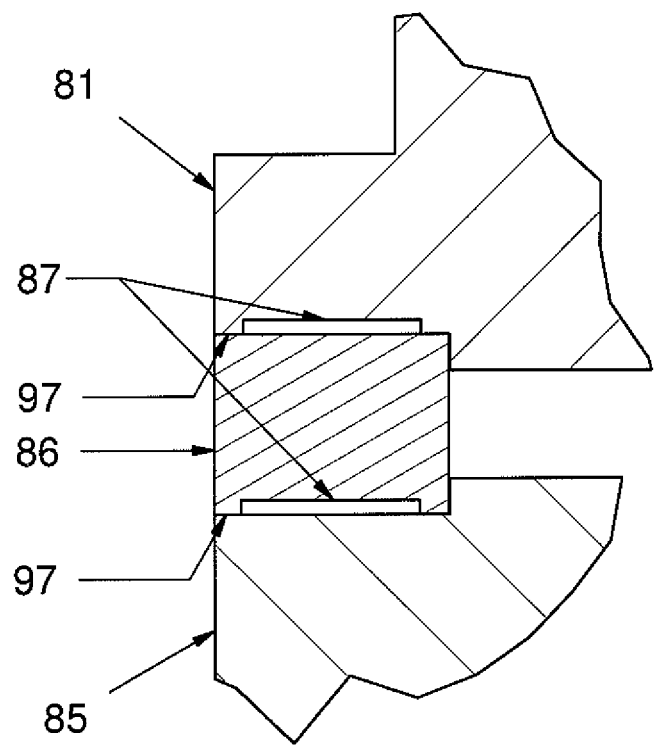
FIG. 24 shows a close up cross-sectional view of an embodiment of the center rotation shaft assembly.

In one embodiment, as best shown in FIGS. 3-5 the upper flow guide 32 has a first (upper) diameter D-1 substantially equal to the diameter of the adjustable proportional flow injector (APFI) 7 and second (lower) diameter D-2 substantially equal to the diameter d3 of the wafer carrier 76 (as shown in FIG. 20). As illustrated in the figures, the first diameter D-1 is smaller than the second diameter D-2. The first diameter D-1 preferably is from about 0.2 to 0.5 of the second diameter D-2. The upper flow guide 32 is not strictly conical shaped, but rather curved as the guide extends downward and flares out as it approaches D-2. The upper flow guide 32 creates a gas flow pattern where a uniformly distributed, downward-flowing gas stream is directed towards the wafer carrier 76, but the gas stream is also turned laterally and expanded, so that a smaller diameter flow injector 5 can be used to uniformly distribute flow over a substantially larger wafer carrier 76, without the occurrence of recirculation of gas within the reactor chamber volume 33.

The curved or flared profile of the upper flow guide 32 provides approximately equal radial gas velocity. An upper flow guide 32 with this geometry is alternately referred as an expanding cone upper flow guide 32. While not bound by theory, for a gas flow moving radially outward, the gas must cross a continuously increasing cross sectional area (which increases with radius for cylindrical geometries), and as a result, the flow velocity must decrease. In order to maintain a substantially constant velocity, the height H-1 of the containing geometry may be gradually reduced, so that the cross sectional area (product of circumference multiplied by height) remains substantially constant, which counteracts the increase of the circumference with radius.

The flow flange assembly 3 preferably has a fluid gap 37 positioned directly behind the upper flow guide 32 (between the upper flow guide 32 and the main flange body 30). In embodiments of the invention, the fluid gap 37 is relatively thin (about 0.1 inches or less) which, for fluid flow rates of approximately 1 gallon per minute and for fluids having density and viscosity values within an order of magnitude of water, will result in a Reynold's number value of less than 3200, which is indicative of laminar flow within the fluid gap and efficient usage of fluid. This configuration results in reduced usage of fluid and/or reduces the capacity of a fluid recirculator (if a reservoir/recirculator heat exchanger system is to be employed).

The flow flange assembly 3 may further comprise bottom/outer to top/inner flow through the fluid gap 37 for air removal and counter-flow heat exchange. That is, fluid flows in a reverse direction through the fluid gap from the direction the gas is flowing in the reactor volume. This type of flow path through the fluid gap is achieved in one embodiment from a supply channel 41, optionally down through one or more supply conduits (not shown). Each supply channel 41 has one or more flow restricting orifices 40 proximate to the end of each supply channel 41. The flow restrictive orifices 40 sufficiently restrict the flow such that an equal flow rate of fluid passes through each supply channel, immediately prior to entering the fluid gap 37, producing a uniform flow delivery around the outer circumference of the fluid gap 37. Fluid flows radially inward though the fluid gap 37, and then passes through a second set of flow restricting orifices 40 within that transfers the fluid to a return channel 42 (optionally via one or more return conduits (not shown). Fluid is supplied via supply channel inlet tube 45 and returned through a fluid outlet tube 46. The flow characteristics of the fluid within the fluid gap 37 result in improved temperature uniformity within the reactor chamber volume 33, which improves the uniformity of the gas flow profile and deposition uniformity. The bottom/outer to top/inner flow pattern in the fluid gap 37 results in counter-flow heat exchange and effective removal of air from the gap 37.

A gap 43 between upper flow guide 32 at the outermost diameter of the upper flow guide D-2 (i.e. at the end of the upper flow guide proximate to the wafer carrier 76) and wafer carrier upper surface 77 at the outermost diameter d3 of the wafer carrier 76 generally inhibits or prevents recirculation of ejected gas above the wafer carrier 76. As shown particularly in FIGS. 3-5, the wafer carrier 76 rests on the top of a center rotation shaft 75. The upper flow guide 32 outer diameter D-2 is about equal to that of the wafer carrier d3 where the upper flow guide 32 is closest to the wafer carrier 76. At this point, the separation between these two parts H-2 is at a minimum value and the gap 43 facilitates the inhibition or prohibition of recirculation of the ejected gas within the reactor chamber volume 33. For example, the gap may have a dimension H-2 of about 1.00 inch or less, such as about 0.25 inch or less. The gas flowing downward from the adjustable proportional flow injector assembly 5 turns laterally within the reactor chamber volume 33 and flows radially outward. When it reaches the gap 43, the gas achieves a maximum flow velocity, and once past the gap 43, the gas begins to expand and decelerate in an exhaust collection zone 44 that is proximate to the gap 43, thereby preventing backward recirculation of the spent gas mixture, (i.e. the gas which has moved away from the reaction area at and above the wafer carrier 76).

In a preferred embodiment of the invention, the reactor 1 with an expanding cone upper flow guide 32 also incorporates a lower flow guide 72 (discussed in more detail below). The lower flow guide 72 prevents gas recirculation back into the reaction zone, improves smoothness of flow from outer edge of wafer carrier into exhaust ports for more stable overall reactor flow profile, and reduces heat losses at outer edge of wafer carrier 76 for better temperature uniformity and improved material characteristics.

The adjustable proportional flow injector assembly 5 (hereinafter "APFI 5") in an embodiment of the invention is shown particularly in FIGS. 11-18 and 25. The adjustable proportional flow injection is a flow injector that receives multiple gas inlet streams from supply tubes and spreads or diffuses these flows for a uniform outlet flow velocity, while keeping the gas streams separated until they exit. Optionally the APFI 5 also regulates the temperature of the gases as they exit the adjustable proportional flow injector. The APFI 5 is typically cylindrical in shape (circular area and vertical height) and fits within the flow flange assembly 3. A cylindrical APFI is shown in the figures however, the APFI can be made in any shape and the exact shape will generally be dictated by the shape (area) of the upper opening 31 into which it is being mated. For example, if the upper opening 31 has a square or rectangular shape, then the APFI will have a corresponding square or rectangular shape so that it can be mated.

The adjustable proportional flow injector assembly 5 generally comprises a support flange 51, which provides structural integrity for the components mated to the support flange 51 and gas chamber inlet tubes or ports 54 that penetrate through the support flange 51. The support flange 51 further provides for mating the entire adjustable proportional flow injector assembly 5 to a main flange body 30.

The APFI 5 includes one or more gas chambers 52. In an embodiment, one or more of the gas chambers 50 may be machined into a gas chamber machining 52 and are formed from a plurality of gas chamber top walls or surface 57 and gas chamber bottom walls or surface 58. The gas chamber top wall 57 can be machined to form different zones as illustrated in the top views FIGS. 16 and 17. The gas chambers 50 are separated from the other gas chambers 50 by gas chamber vertical walls 59 that extend from the gas chamber top walls 57 to the gas chamber bottom walls 58 thereby forming the gas chambers 50. The one or more gas inlets 54, which may be incorporated into the gas chamber top walls 57, deliver gas to the one or more gas chambers 50 of the adjustable proportional flow injector 5, such as in a vertical direction (i.e. about perpendicular to the gas chamber top walls 57 and gas chamber bottom walls 58).

Each gas chamber 50 may receive a different gas stream and one or more of these gas chambers may spread or diffuse the gas and keep a first gas stream separate from other gas streams or each gas stream separate from another, and create a uniform flow velocity over a specific outlet surface area. Additionally, each gas chamber 50 may be configured in the same shape or different shape as the other gas chambers 50.

Figure 16A:
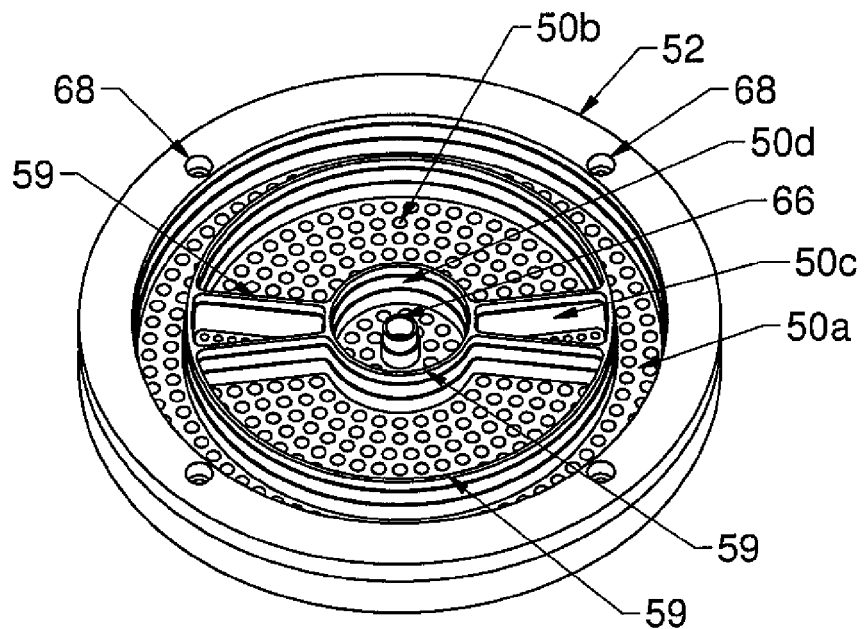
FIG. 16A-B shows a top interior view of an embodiment of the adjustable proportional flow injector gas chamber machining.
Figure 16B:
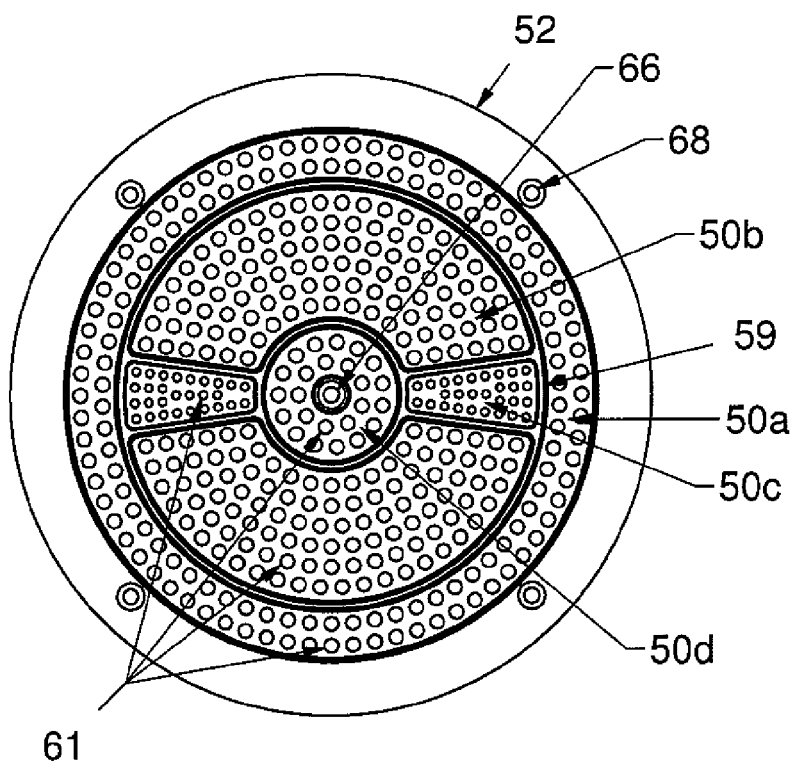

For example, as shown in FIG. 16 (the support flange 51 is removed from the figure) there is an outer gas chamber 50*a*, and four intermediate gas chambers 50*b* and 50*c*, and an inner gas chamber 50*d*. In one embodiment, the gas chamber 50*b* receives Group III reactants and intermediate gas chambers 50*c* receive group V reactants. The chambers 50*a-d* are separated by the vertical walls 59, the gas chamber top walls 57 (not shown) and the gas chamber bottom walls 58.

Figure 17A:
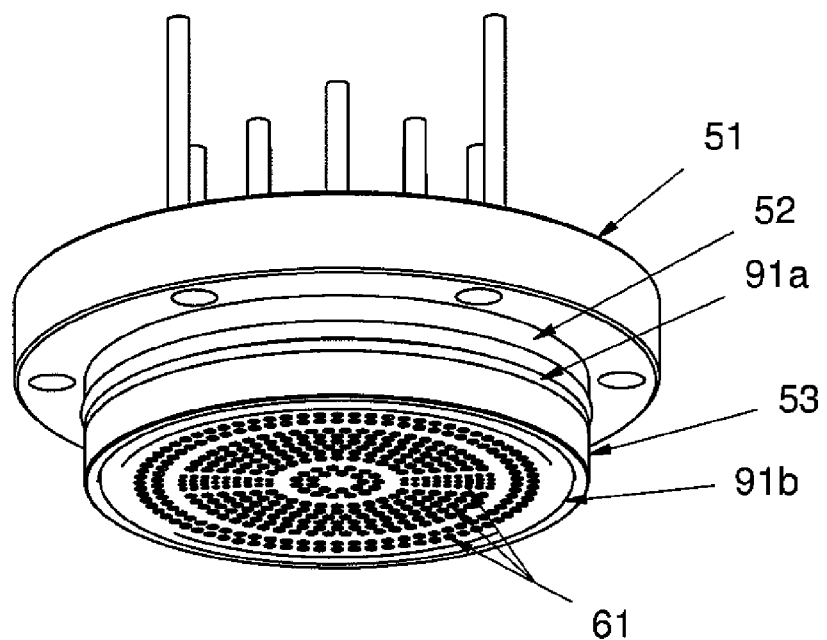
FIG. 17A-B shows a bottom view of an embodiment of the adjustable proportional flow injector assembly
Figure 17B:
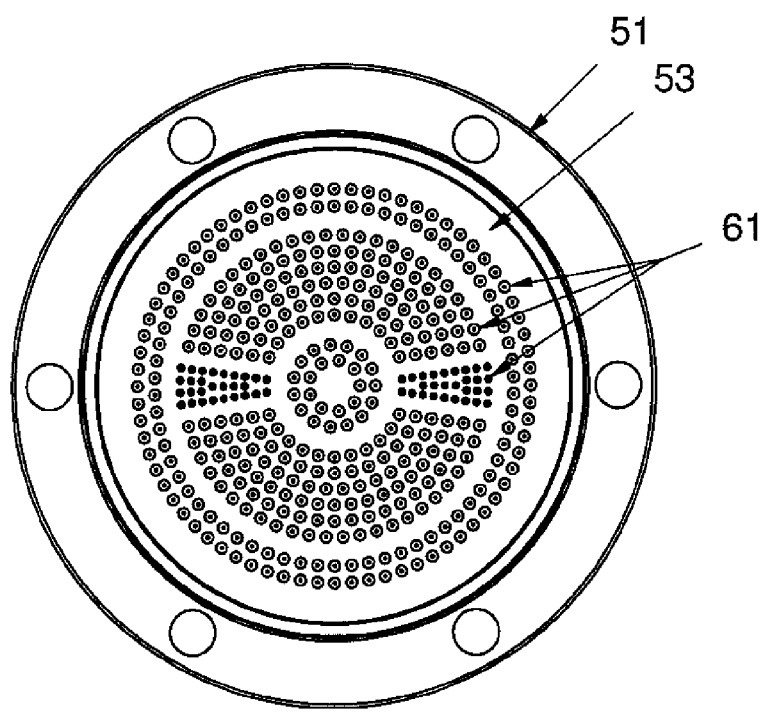

The APFI 5 may also include a fluid cavity 60, which is located below the one or more gas chambers 50. The fluid cavity 60 may be formed by the mating of a fluid cavity machining 53 to the gas chamber machining 52. FIG. 17 shows the bottom view of an embodiment of the adjustable proportional flow injector assembly 5, showing the bottom face of the fluid cavity machining 53. Gas chamber outlets 61 may extend or penetrate from the bottom wall 58 of a gas chamber through the fluid cavity 60, such as through conduit tubes 63, into the reactor chamber volume 33. The conduit tubes 63 may have the same or different inner diameters and same or different outer diameters. Penetration of the conduit tubes 63 through the fluid cavity 60 permits the regulation of the gas temperature prior to introduction of the gases into the reactor chamber volume 33 by the appropriate control of the temperature of the fluid flowing through the fluid cavity 60. The fluid cavity 60 has a fluid cavity outlet 66 positioned at about the center of the fluid cavity 60 connected to a fluid cavity outlet tube 67. Additionally, fluid cavity inlets 68 are provided through fluid cavity inlet tubes 69 towards the periphery of the fluid cavity 60.

In embodiments that contain a fluid cavity diffuser 65 (discussed in more detail below), the fluid cavity outlet 68 is positioned inside the circumference of the diffuser 65, while the fluid cavity inlets 68 are positioned outside of the circumference of the diffuser 65.

The adjustable proportional flow injector assembly 5 may optionally have one or more of the following features. In one embodiment, the gas outlet apertures 61 are preferably a smaller size than the gas inlets 54 (for example there may be from about 100 to about 10,000 gas outlet apertures). The number of gas outlet apertures 61 and the inside diameter and length of the conduit tubes 63 extending through the fluid cavity 60 depends on the specific gas composition, flowrate, temperature and pressure and are also limited by the total surface area of the bottom wall 58 of a gas chamber and by manufacturing capabilities and costs, the difficulty and cost increasing as the outside and inside diameters of the conduit tubes 63 decreases and as the spacing of adjacent gas outlet apertures 61 decreases. Generally, however, the total cross sectional area of all of the conduit tubes 63 is preferably a factor between 2 and 6 times larger than the cross sectional area of the gas inlet 54 to a given gas chamber. This arrangement accounts for the greater wall surface area and corresponding fluid shear and pressure drop of the smaller-diameter conduit tubes 63 compared to the gas inlet 54, such that the pressure drop across the set of conduit tubes of a given gas chamber (that is, the pressure drop from the gas chamber to the reactor chamber volume 33) is preferably from several Torr to several tens of Torr.

The gas chamber upper walls 57 and gas chamber bottom walls may preferably be substantially parallel. The upper walls/surface 57 of all gas chambers can be substantially co-planar they can alternatively be on different planes. Similarly gas chamber bottom walls 58 of all gas chambers 50 can be co-planar or alternatively on different planes.

The adjustable proportional flow injector assembly 5 may optionally comprise one or more intermediate diffusing baffle plates 55 between and substantially parallel to the gas chamber upper walls 57 and the gas chamber bottom walls 58. When an intermediate diffusing baffle plate 55 is used, an upper gas chamber section 50*a* and a lower gas chamber section 50*b* is formed in the gas chamber 50 comprising the intermediate diffusing baffle plates 55. For example, the upper gas chamber section 50*a* may be defined, generally, by the gas chamber upper wall 57, an upper surface of the intermediate diffusing baffle plate 55 and any side wall(s) 59 and the lower gas chamber section 50*b* may be defined generally by the gas chamber lower wall 58, a lower surface of the intermediate diffusing baffle plate 55 and any side wall(s) 59.

Gas outlet apertures 61 of each gas chamber 50 are joined to outlet conduits (preferably small diameter tubes) 63 penetrating through the fluid cavity 60 which may be attached to or otherwise joined to the fluid cavity machining 53 thereby forming a lower fluid cavity wall proximate to the lowermost side of which is a boundary surface of the reactor chamber volume 33. The outlet conduits 63 preferably have an aperture pattern matching that of the combined set of gas chamber outlet apertures 61.

A further embodiment of the adjustable proportional flow injector assembly 5 concerns a fluid temperature control zone with uniform, radial flow profile. Temperature regulating fluid, for example cooling fluid, flows into an outer distribution channel 62. In an embodiment of the invention, the fluid cavity 60 has a fluid cavity diffuser 65. The fluid cavity diffuser 65 is preferably a thin, cylindrical sheet metal ring having a height slightly larger than the height of the fluid cavity 60 and is preferably as thin as possible. In the preferred embodiment, the cylindrical sheet metal ring inserts into opposing circular grooves in the bottom surface of the gas chamber machining 53 and the upper surface of the fluid cavity machining 52, the sum of the depth of these two grooves preferably being equal to the additional height of the flow diffusing barrier over that of the fluid cavity, so that fluid delivered to the fluid cavity 60 at multiple inlets 68 at the outermost periphery of the fluid cavity must immediately move tangentially before flowing through a plurality of preferably equally spaced small apertures 64 in the flow diffusing barrier 65, resulting in a uniform flow distribution from the outermost periphery of the fluid cavity 60 radially inward towards the single outlet 66 at the center outlet 66 of the fluid cavity 60. The small apertures 64 act as flow restricting orifices, which sufficiently restrict flow so as to result in an equal flow through each aperture 64

Figure 25A:
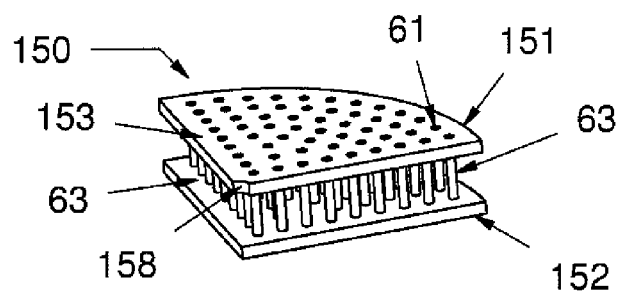
FIG. 25a-c shows an alternate embodiment of subassemblies of the gas chambers of the adjustable proportional flow injector assembly.
Figure 25B:
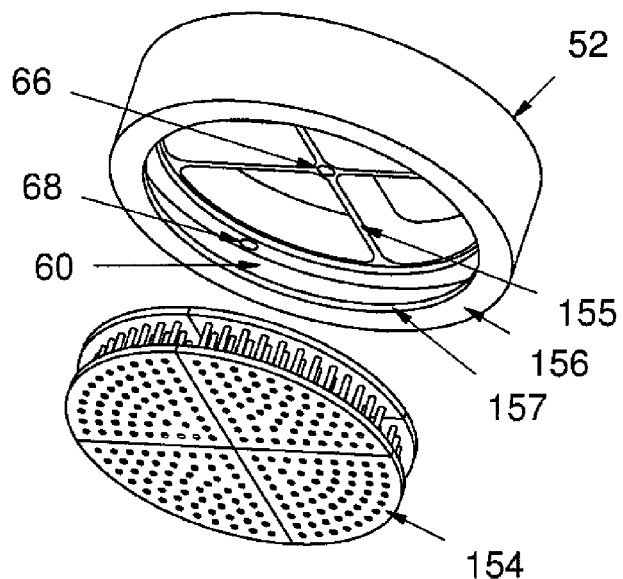
Figure 25C:
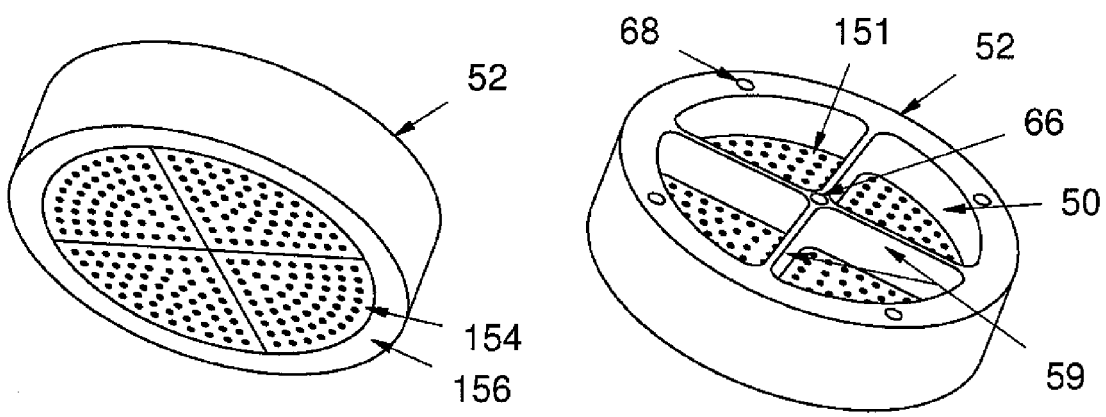

FIG. 25(*a-c*) illustrates an alternate method of fabricating the APFI. Not all APFI components previously described are shown. In order to increase the ease and efficiency of both the manufacture and testing of the APFI, components of the APFI can be assembled from interchangeable modules or subassemblies. For example, gas outlet aperture sub-assemblies 150 can be constructed from an upper plate 151, a lower plate 152, and multiple conduits 63. The upper plate 151 constitutes the bottom wall 58 of a gas chamber 50 described above. The lower plate 152 constitutes a portion of the bottom wall 58 of the fluid cavity machining 53 previously described.

In this embodiment, the gas chamber machining 52 is constructed to receive multiple gas outlet aperture sub-assemblies 150, such that the upper surface 153 of the upper plate 151 mates flush to one or more lower surfaces 155 of gas chamber walls 59 previously described. The seam between the upper plates 151 of adjacent gas outlet aperture sub-assemblies 150 falls along the centerline of a given lower surface 155 of a gas chamber wall 59 so that a seal may be formed that prevents any leakage between the fluid cavity 63 thus formed and any gas chamber 50.

In the embodiment shown in FIGS. 25(*a-c*), the seam between the lower plates 152 of adjacent gas outlet aperture sub-assemblies 150 and between the lower plate 152 of a given gas outlet aperture sub-assembly 150 and the lower fluid cavity wall 157 integral with that gas chamber machining 52 may be sealed to prevent any leakage between the fluid cavity 63 and the reactor chamber volume 33. In one embodiment, it may be sealed in such a manner that the lower surface 154 of each gas outlet aperture sub-assembly 150 is flush with the lower surface 154 of all other gas outlet aperture sub-assemblies 150 and the lower surface 156 of the gas chamber machining, although this is not required. Fluid is thus delivered into the fluid cavity 63 through multiple fluid cavity inlets 68 and exits through one or more fluid cavity outlets 66, where the fluid cavity diffuser 65 (not shown) is positioned in a similar manner as previously described.

A further embodiment of the invention concerns methods for creating patterns of substantially equally spaced gas outlets in one or more radial patterns. In accordance with these methods, one or more patterns of circular holes are arranged such that the holes are equidistant from each other, such as in square or hexagonal patterns. For the radial zones comprising the adjustable proportional flow injector gas chambers, a method comprises distributing holes so that they are substantially equidistant from each other as well as area boundaries. This method generally comprises the steps of (1) arranging a first set of holes on a first line adjacent and parallel to a first radial area boundary, with equal spacing between these holes in a radial direction, (2) determining the angle, with vertex at the center axis of the machining, between a first point on the first line at a first radial distance from the center axis and the corresponding second point on a second line adjacent and parallel to a second radial area boundary, (3) determining the length of the arc, with origin at the center of the gas chamber machining, between a first hole at a given radius lying adjacent to the first radial area boundary and the corresponding second hole at the same radius lying adjacent to the second corresponding radial area boundary, (4) dividing this arc length by the desired center-to-center hole spacing distance and (5) rounding the resulting number to the nearest integer. Steps (2)-(5) are repeated for each hole comprising the set described in step (1). This method produces a hole pattern with equal separation between radial sets of holes, and nearly equal separation of holes within each radial set of holes. This method is particularly useful for producing substantially equidistant sets of holes in circular or semi-circular patterns over small areas, where irregularities in hole spacing are more significant than for patterns over large areas.

The reactors may also comprise a gas distribution zone having adjustability with no zone separating barriers (such as illustrated in FIG. 17). In this embodiment, the reactors comprise two or more gas inlet tubes 54 and a plurality of outlet holes 61 that geometrically function to produce an adjustable outlet flow pattern through the plurality of holes 61. While not bound by theory, by increasing or decreasing the amount flow to one or more of the inlet tubes 54, without having any discrete vertical separation wall 59 between any of the inlet tubes 54, stagnation areas that would normally be produced by the area below the separation walls, which can have not outlet flow holes, are eliminated.

The adjustable proportional flow injector assembly 5 may further comprise one or more sealed chamber tops, such as one or more o-ring sealed chamber tops, for cleaning and/or baffle changes. In a preferred embodiment, the gas chamber machining 52 includes o-ring grooves machined into the top surface of the vertical walls 59 separating the gas chambers, which eliminates the gas chamber zone upper walls 57. This is because an o-ring lying along the upper surface of the vertical walls can seal directly to the lower surface of the support flange 51 or other single intermediate sealing surface (rather than a plurality of welded surfaces). This configuration allows the gas chambers to be opened and cleaned or inspected, as well as reducing the number of parts required.

Figure 18:
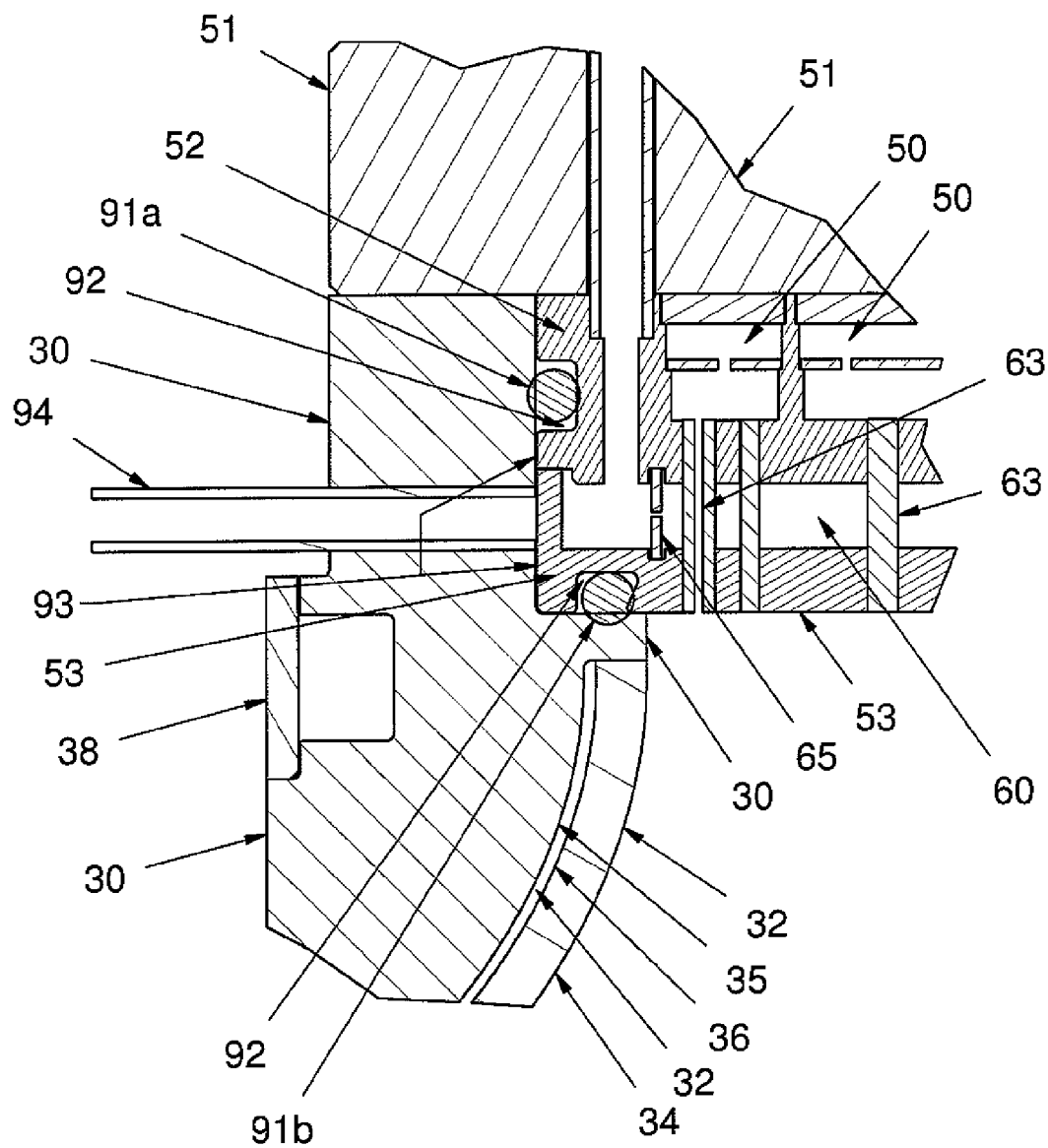
FIG. 18 shows a close up cross-sectional view of the dual o-ring seal of the adjustable proportional flow injector assembly sealed to a flow flange assembly.
Figure 19:
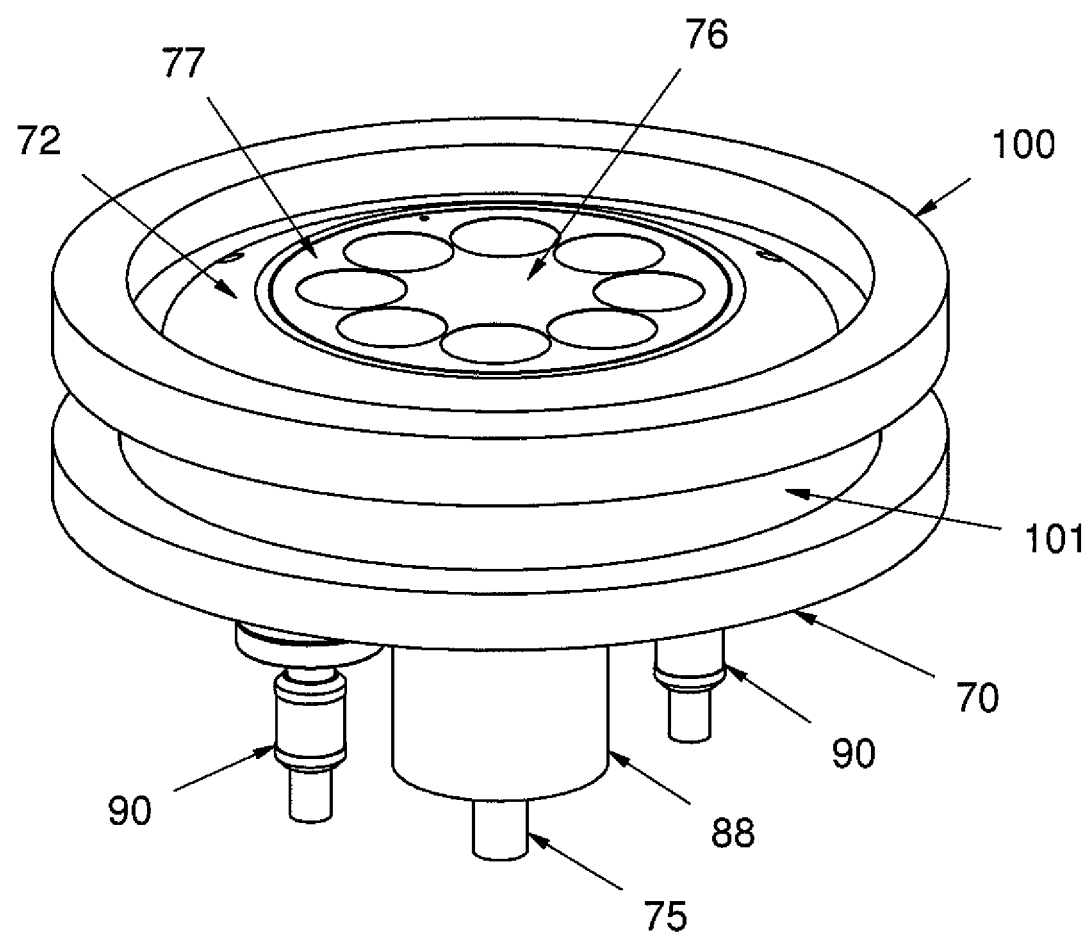
FIG. 19 shows a perspective view of an embodiment of the chamber assembly.

In a further embodiment, the adjustable proportional flow injector assembly 5 comprises a dual o-ring seal with vacuum barrier zone, best illustrated in FIG. 18. Dual o-ring seal produced by o-rings 91 in o-ring grooves 92 in the gas chamber machining 52 and the fluid cavity machining 53. One o-ring 91a is positioned between the gas chamber machining 52 and the main flange body 31. A second 91b is positioned between the fluid cavity machining 53 and the main flange body 30. A vacuum cavity 93 is created between the APFI, the main flange body 31, and the o-rings 91. A differential seal vacuum port tube 94 is included in the main flange body 31 to create and release the vacuum seal. This configuration permits easy removal of the adjustable proportional flow injector 5 while negating gas molecule permeation of the o-ring elastomer material, due to the significantly lower vacuum levels produced in the volume in between the two o-ring seals than on either side of each seal.

An embodiment of the chamber assembly 7 is shown in FIGS. 19-20 and FIGS. 3-5. The chamber assembly 7 has a reactor baseplate main body 70. The reactor baseplate main body is connected to a reactor jar top flange 100 via a reactor jar wall 101. The reactor jar top flange 100 mates with the main flange body 30 of the flow flange assembly 3. The baseplate main body 70 contains ports for a number of components useful in CVD reactors such as a center rotation shaft 75 (discussed in more detail below), base plate exhaust tubes 79; high current feedthrough 90; and rotary vacuum feedthrough housing 88.

The chamber assembly 7 has components typically found in a CVD reactor such as a heater assembly comprising a heat source and heat reflecting shields for heating the wafer carrier 76. In the embodiment shown, one or more heating elements 83 are positioned under the wafer carrier 76 and one or more heat shields 84 are positioned under the heating elements 83. For example, the heat source may be a filament for radiant heating or a copper tube for inductive heating, preferably arranged in a concentric circular pattern to match the circular area of the wafer carrier. Other types of heater assemblies may be used for heating the wafer carrier 76.

The chamber assembly 7 has a lower flow guide 72. The lower flow guide 72 has a frustoconical shape. The conical shaped lower flow guide 74 has an inner diameter d-1 and an outer diameter d-2. Preferably, the inner diameter d-1 is slightly larger than outer diameter d3 of the wafer carrier 76, although the inner diameter d-1 can be approximately the same, smaller or larger than the outer diameter d3 of the wafer carrier 76. The lower flow guide 72 is aligned approximately with the top surface 77 of wafer carrier 76. The outer diameter d-2 of the lower flow guide 72 is larger than the inner diameter d-1 creating a sloping surface in the downward direction.

In the preferred embodiment, the inner diameter d-1 is slightly larger than outer diameter d3 of the wafer carrier 76. The spacing between the inner diameter d-1 of the lower flow guide 72 and the outer diameter of the wafer carrier 76 forces the gas ejected from the gap 43 between the wafer carrier 76 and the upper flow guide 32 to expand gradually, and inhibits or prevents recirculation of the ejected gas below the outer edge of the wafer carrier 76. Preferably, the inner diameter d-1 of the lower flow guide and the outer diameter of the wafer carrier 76 are in close proximity to provide a narrow lower flow guide gap between the two, as the narrower the lower flow guide gap the more efficient ejection of the gas and greater the inhibition or prevention of the recirculation of gases within the reactor chamber volume 33. In a preferred embodiment, the lower flow guide 72 is fabricated from graphite.

The chamber assembly 7 may contain a lower flow guide reflector 74. The lower flow guide reflector 74 is positioned within the lower flow guide 72 and extending from the circumference of the wafer carrier 76 and angled in a downward direction. The reflector 74 is constructed of a thin piece of metal, preferably molybdenum. The reflector 74 acts to reflects heat inward and helps keep the heat constant over the surface of the lower flow guide 72.

In an embodiment, the lower flow guide 72 may be constructed of one or more sections or pieces, such as a two-piece lower flow guide 72. Due to the close spacing between the lower flow guide 72 and the wafer carrier 76, and due to the high temperature the wafer carrier 76 reaches during processing, in an alternate embodiment, the lower flow guide 76 has a first piece that is immediately adjacent to the wafer carrier 76 fabricated from a material having a superior temperature tolerance and coefficient of thermal expansion about equal to or similar to that of the wafer carrier 76 material (typically graphite, sapphire or a refractory metal), and a second piece fabricated from a material that does not have such temperature tolerance or coefficient of thermal expansion, such as a material that is less expensive and more easily formed than the material that comprises the first piece. In a preferred embodiment, the first piece is fabricated from graphite to provide the appropriate temperature tolerance and coefficient of thermal expansion match with the wafer carrier material.

The lower flow guide 72 may be in part or wholly an extension of the wafer carrier 76 extending from the diameter d3 of the surface of the wafer carrier 76 that holds the wafer, i.e. an outer edge profile of the wafer carrier surface 77 that holds the wafers. In this embodiment, all or a portion of the lower flow guide 76 is an extension of the wafer carrier from the outer circumference of preferably the wafer carrier top surface 77, or alternatively the lower surface 78, or at some point along the circumference in between. In a particular embodiment, the lower flow guide 72 has a first section which is an extension of the wafer carrier 76, such as within the first few centimeters from the narrow gap 40 between the wafer carrier outer diameter 76 and the upper flow guide 72, and a second piece that is completely separate from the wafer carrier 76 and is formed as a separate piece adjacent to the first piece.

The wafer carrier 76 for the reactor 1 may be a conventional one piece structure, however, embodiments having alternative structures are within the scope of the invention. For example, in an embodiment of the invention, the reactor may comprise a two-piece wafer carrier 76 comprising a removable top (i.e. platter or surface that holds the wafers) and a bottom. The removable top may be made from a number of materials, preferably sapphire and bottom may comprise graphite and may further comprise a means for heating, such as RF heated (for inductive heating of bottom and conductive heating of removable top and any wafers on the surface of the removable top). The two-piece wafer carrier can have the removable top replaced when necessary while the bottom can be reused.

For example, in one embodiment a two-piece wafer carrier has a sapphire removable top for holding the wafers and a graphite bottom that supports the sapphire removable top. The sapphire top is non-porous and will not degrade, which occurs with surfaces conventionally used, such as SiC encapsulant. The sapphire removable top can also be cleaned more rigorously (such as a rapid wet chemical etch, which is not easily performed with the graphite wafer carriers). The graphite bottom piece is a heat absorber for conductive heat transfer into the sapphire removable top and the wafers on the surface of the removable top, such as within wafer pockets that may be machined in an upper surface of the removable top.

In a further embodiment, the wafer carrier 76 is integral with (i.e. machined directly into) a portion of the center rotation shaft 75, which shaft 75 extends downward from the center of a bottom surface 78 of the wafer carrier 76. The center shaft 75 (alternatively, the center rotation shaft 75) extends downward through a heating coil and is comprised of a material suitable for heating, for example a material suitable for induction heating. This center rotation 75 shaft can be heated just as the main portion of the wafer carrier 76 is, and provides a thermal barrier to the conductive heat losses that may occur with conventional supporting spindle shafts.

The center rotation shaft 75 for the wafer carrier 76 may be a conventional one piece structure; however, embodiments having alternative structures may be used. For example, in one embodiment as shown in FIGS. 21-24, a multi-segment shaft 75 for the rotating wafer carrier, i.e. a shaft comprising one or more segments made from the same material or different material is used. In multi-segment embodiments, at least one segment will have a substantially lower thermal conductivity than the remaining shaft segment(s) used. The multi-segment spindle is particularly useful in conjunction with radiant heaters although the invention is not necessarily limited in this regard.

In the embodiment shown in FIGS. 21-24, there are three segments. A shaft upper segment 81 is directly in contact with the wafer carrier 76. The shaft upper segment 81 has a susceptor or flange 82 at the proximal end on which the bottom surface 78 of the wafer carrier 76 rests. When radiant heaters are used, the upper segment is preferably fabricated from a material (such as alumina or sapphire) having a lower thermal conductivity than the one or more of the remaining segment(s) of the multi-segment shaft 75. This selection of material produces the highest possible thermal transfer resistance. Segment interfaces between the multi-segment center shaft 75 and the wafer carrier 76 can be designed with minimal surface to further enhance the thermal transfer resistance. These features improve the temperature uniformity near the center area of the wafer carrier, as well as reduce energy losses in operation of the reactor.

Alternatively, when an inductive heater is used in the reactor, the segment in contact with the wafer carrier (the shaft upper segment 81) extends downward through an inductive heating coil. In this instance, the upper segment 81 is made of a material suitable for inductive heating. For example, when an inductive heater is used in the reactor, the upper segment 81 of the multi-segment center shaft 75 is preferably constructed of graphite.

In one embodiment, the multi-segment shaft 75 has a shaft lower segment 85 is constructed of a material that does not readily heat inductively (such as sapphire). The shaft upper segment 81 and shaft lower segment 85 are connected via a spacer 86 that is, preferably, constructed from alumina. The interfaces between the three (or more) segments preferably have minimal surface contact area to produce the highest possible thermal transfer resistance. The surface area may be reduced by including machined recesses 87 in the segments at the point of interface (shown in FIG. 24); to create thin rails 96 around the circumference of the ends of the segments. Contact between the segments only occurs at the thin rails 96 as opposed to the entire area of the segment ends. The segments are preferably secured by way of vented head cap screws 97.

There will be various modifications, adjustments, and applications of the disclosed invention that will be apparent to those of skill in the art, and the present application is intended to cover such embodiments. Accordingly, while the present invention has been described in the context of certain preferred embodiments, it is intended that the full scope of these be measured by reference to the scope of the following claims.

What is claimed is:

1. A chemical vapor deposition reactor comprising:
   a central axis of symmetry;
   a flow flange assembly having a top and a bottom located opposite to the top of the flow flange assembly, wherein the flow flange assembly comprises a main flange body and an upper flow guide comprising an adjacent wall, having an interior surface and an exterior surface located opposite to the interior surface, connected to the main flange body and located between the main flange body and a reaction chamber volume, wherein a first gap is formed between the interior surface of the adjacent wall of the upper flow guide and the main flange body of the flow flange assembly, wherein the flow flange assembly has (a) a bottom end interior surface with a normal line that is parallel to the central axis of symmetry and (b) a top end interior surface with a normal line that is perpendicular to the central axis of symmetry;
   a flow injector connected to the top of the flow flange assembly; and
   a wafer carrier located adjacent to the bottom of the flow flange assembly, wherein the exterior surface of the adjacent wall has a top end and a bottom end located opposite to the top end, wherein the top end of the exterior surface has a diameter that is less than a diameter of the bottom end of the exterior surface, wherein the central axis of symmetry traverses the flow flange assembly, the flow injector and the wafer carrier, wherein a second gap is provided between the exterior surface of the adjacent wall of the upper flow guide at an outermost diameter of the upper flow guide and an upper surface of the wafer carrier at an outermost diameter of the wafer carrier, wherein the second gap is at a minimum value compared to values for all other vertical separations between the exterior surface of the adjacent wall and the upper surface of the wafer carrier, and further wherein the first gap contacts the interior surface of the adjacent wall and extends along the interior surface of the adjacent wall from an innermost diameter of the upper flow guide to an outermost diameter of the upper flow guide.

2. The chemical vapor deposition reactor of claim 1 wherein the first gap has a thickness of about 0.1 inches or less.

3. The chemical vapor deposition reactor of claim 1, wherein the main flange body comprises a first channel in fluid communication with the first gap at the bottom/outer portion of the first gap and a second channel in fluid communication with the first gap at the top/inner portion of the first gap, wherein fluid is flowable from one channel to another channel, thereby effecting temperature control of the exterior surface of the upper flow guide.

4. The chemical vapor deposition reactor of claim 3 wherein the fluid is flowable in a reverse direction through the first gap with respect to a direction that the gas is flowable in a reactor chamber volume.

5. The chemical vapor deposition reactor of claim 1, wherein the adjacent wall of the upper flow guide has an upper diameter substantially equal to a diameter of the flow injector and a lower diameter substantially equal to a diameter of the wafer carrier, wherein the upper diameter of the adjacent wall of the upper flow guide is smaller than the lower diameter of the adjacent wall of the upper flow guide.

6. The chemical vapor deposition reactor of claim 1, wherein the flow injector is connected to a mating port on the flow flange assembly, wherein the flow injector comprises one or more supply tubes, one or more gas chambers receiving inlet gas streams from the supply tubes, a fluid cavity below the gas chambers, and one or more outlet conduits exiting the gas chambers and penetrating through the fluid cavity.

7. The chemical vapor deposition reactor of claim 1, wherein the flow injector is configured to keep one or more gas streams separated prior to exit, and wherein the flow flange assembly is configured to regulate the temperature of the gases as the gases exit the flow flange assembly.

8. The chemical vapor deposition reactor of claim 1 further comprising a chamber assembly connected to the flow flange assembly wherein the chamber assembly comprises a heating assembly located below the wafer carrier and a lower flow guide surrounding the wafer carrier.

9. The chemical vapor deposition reactor of claim 1, wherein the minimum value for the second gap is about one inch or less.

10. The chemical vapor deposition reactor of claim 1, wherein the curved cross-sectional profile of the exterior surface of the upper flow guide is continuously curvilinear from the top end of the exterior surface of the adjacent wall of the upper flow guide to the bottom end of the exterior surface of the adjacent wall of the upper flow guide.

11. A chemical vapor deposition reactor comprising:
a central axis of symmetry;
a flow flange assembly having a top and a bottom located opposite to the top of flow flange assembly, wherein the flow flange assembly comprises a main flange body and an upper flow guide comprising an adjacent wall, having an interior surface and an exterior surface located adjacent to the interior surface, connected to the main flange body and located between the main flange body and a reaction chamber volume, wherein a first gap is formed between the interior surface of the adjacent wall of the upper flow guide and the main flange body of the flow flange assembly, wherein the flow flange assembly has (a) a bottom end interior surface with a normal line that is parallel to the central axis of symmetry and (b) a top end interior surface with a normal line that is perpendicular to the central axis of symmetry;
a flow injector connected to the top of the flow flange assembly; and
a wafer carrier located adjacent to the bottom of the flow flange assembly,
wherein the central axis of symmetry traverses the flow flange assembly, the flow injector and the wafer carrier,
wherein the upper flow guide has an entire length defined between a top end and a bottom end located opposite to the top end;
wherein the first gap contacts the interior surface of the adjacent wall, corresponds to the curved cross-sectional profile of exterior surface of the upper flow guide and extends the entire length of the upper flow guide,
wherein a second gap is provided between the exterior surface of the upper flow guide at an outermost diameter of the upper flow guide and an upper surface of the wafer carrier at an outermost diameter of the wafer carrier, wherein the second gap is at a minimum value compared to values for all other vertical separations between the exterior surface of the upper flow guide and the upper surface of the wafer carrier.

12. A chemical vapor deposition reactor comprising:
a central axis of symmetry;
a flow flange assembly having a top and a bottom located opposite to the top of flow flange assembly, wherein the flow flange assembly comprises a main flange body and an upper flow guide comprising an adjacent wall, having an interior surface and an exterior surface located opposite to the interior surface, connected to the main flange body and located between the main flange body and a reaction chamber volume, wherein a first gap, having a thickness of about 0.1 inches or less, is formed between the interior surface of the adjacent wall of the upper flow guide and the main flange body of the flow flange assembly, wherein the first gap contacts and extends along the interior surface of the adjacent wall, wherein the flow flange assembly has (a) a bottom end interior surface with a normal line that is parallel to the central axis of symmetry and (b) a top end interior surface with a normal line that is perpendicular to the central axis of symmetry;
a flow injector connected to the top of the flow flange assembly; and
a wafer carrier located adjacent to the bottom of the flow flange assembly,
wherein the central axis of symmetry traverses the flow flange assembly, the flow injector and the wafer carrier wherein a second gap is provided between the exterior surface of the adjacent wall of the upper flow guide at an outermost diameter of the upper flow guide and an upper surface of the wafer carrier at an outermost diameter of the wafer carrier, wherein the second gap is at a minimum value compared to values for all other vertical separations between the exterior surface of the upper flow guide and the upper surface of the wafer carrier.

13. A chemical vapor deposition reactor comprising:
a central axis of symmetry;
a flow flange assembly having a top and a bottom located opposite to the top of flow flange assembly, wherein the flow flange assembly comprises a main flange body and an upper flow guide comprising an adjacent wall, having an interior surface and an exterior surface located opposite to the interior surface, connected to the main flange body and located between the main flange body and a reaction chamber volume, wherein a first gap contacts the interior surface of the adjacent wall and extends along the interior surface of the adjacent wall between the adjacent wall of the upper flow guide and the main flange body of the flow flange assembly, wherein the flow flange assembly has (a) a bottom end interior surface with a normal line that is parallel to the central axis of symmetry and (b) a top end interior surface with a normal line that is perpendicular to the central axis of symmetry;
a flow injector connected to the top of the flow flange assembly; and
a wafer carrier located adjacent to the bottom of the flow flange assembly, wherein the exterior surface of the upper flow guide has a curved cross-sectional profile along a length of the exterior surface defined between a top end of the adjacent wall to a bottom end of the adjacent of the upper flow guide, wherein the bottom end of the adjacent wall is located opposite to the top end of the adjacent wall,
wherein the central axis of symmetry traverses the flow flange assembly, the flow injector and the wafer carrier,
wherein a second gap is provided between the exterior surface of the upper flow guide at an outermost diameter of the upper flow guide and an upper surface of the wafer carrier at an outermost diameter of the wafer carrier, wherein the second gap is at a minimum value compared to values for all other vertical separations between the exterior surface of the adjacent wall and the upper surface of the wafer carrier,
wherein the upper flow guide has an upper diameter and a lower diameter, and further wherein the upper diameter is (i) less than a diameter of the wafer carrier and (ii) about 0.2 to 0.5 of the lower diameter.

14. The chemical vapor deposition reactor according to claim 1, wherein the main flange body has an underside that receives the interior surface of the adjacent wall of the upper flow guide to form the first gap between the upper flow guide and the main flange body.

15. The chemical vapor deposition reactor according to claim 3, wherein the first channel has one or more orifices located proximate to an end of the first channel and adjacent to the bottom/outer portion of the first gap.

16. The chemical vapor deposition reactor according to claim 15, wherein fluids are flowable from the first channel to the first gap via the one or more orifices of the first channel.

17. The chemical vapor deposition reactor according to claim 16, wherein the one or more orifices of the first channel are configured to restrict flow of the fluids such that a substantially equal flow rate of fluid passes through each orifice, producing a uniform flow delivery around an outer circumference of the first gap.

18. The chemical vapor deposition reactor according to claim 3, further comprising:
one or more orifices connecting the top/inner portion of the first gap and the second channel.

19. The chemical vapor deposition reactor according to claim 18, wherein fluids are transferable from the first gap to the second channel via the one or more orifices.

* * * * *